United States Patent
Miyakawa et al.

(10) Patent No.: US 7,218,546 B2
(45) Date of Patent: May 15, 2007

(54) INTEGRATED CIRCUIT DEVICE PROVIDED WITH SERIES-CONNECTED TC PARALLEL UNIT FERROELECTRIC MEMORY AND METHOD FOR TESTING THE SAME

(75) Inventors: Tadashi Miyakawa, Yokohama (JP); Daisaburo Takashima, Yokohama (JP); Shinichiro Shiratake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 91 days.

(21) Appl. No.: 11/109,769

(22) Filed: Apr. 20, 2005

(65) Prior Publication Data

US 2006/0077703 A1    Apr. 13, 2006

(30) Foreign Application Priority Data

Sep. 24, 2004    (JP)    ............................. 2004-278100

(51) Int. Cl.
*G11C 11/22*    (2006.01)
*G11C 7/00*    (2006.01)

(52) U.S. Cl. ................. 365/145; 365/149; 365/189.05; 365/201

(58) Field of Classification Search ................ 365/145, 365/159, 201, 189.05, 149
See application file for complete search history.

(56) References Cited

U.S. PATENT DOCUMENTS

| | | | | |
|---|---|---|---|---|
| 6,038,162 A | * | 3/2000 | Takata et al. | ................ 365/145 |
| 6,191,971 B1 | * | 2/2001 | Tanaka et al. | .............. 365/145 |
| 6,847,561 B2 | * | 1/2005 | Hashimoto et al. | .... 365/189.07 |

FOREIGN PATENT DOCUMENTS

JP    2002-313100    10/2002

* cited by examiner

*Primary Examiner*—Son Dinh
(74) *Attorney, Agent, or Firm*—Oblon, Spivak, McClelland, Maier & Neustadt, P.C.

(57) ABSTRACT

An integrated circuit device comprises a memory cell block, a word line selecting circuit and a driving circuit. The memory cell block comprises memory cells connected in series. The memory cell comprises a cell transistor including a gate which is connected to a word line, and a ferroelectric capacitor connected to terminals of the cell transistor. The word line selecting circuit successively selects the word lines connected to the cell transistors in the memory cells in the memory cell block in response to address signals successively input from an outside of the device, during an active cycle. The driving circuit applies a given voltage between ends of a current path provided of the cell transistors in the memory cells in the memory cell block, during a time period for which the word lines connected to the cell transistors are successively selected by the word line selecting circuit.

19 Claims, 19 Drawing Sheets

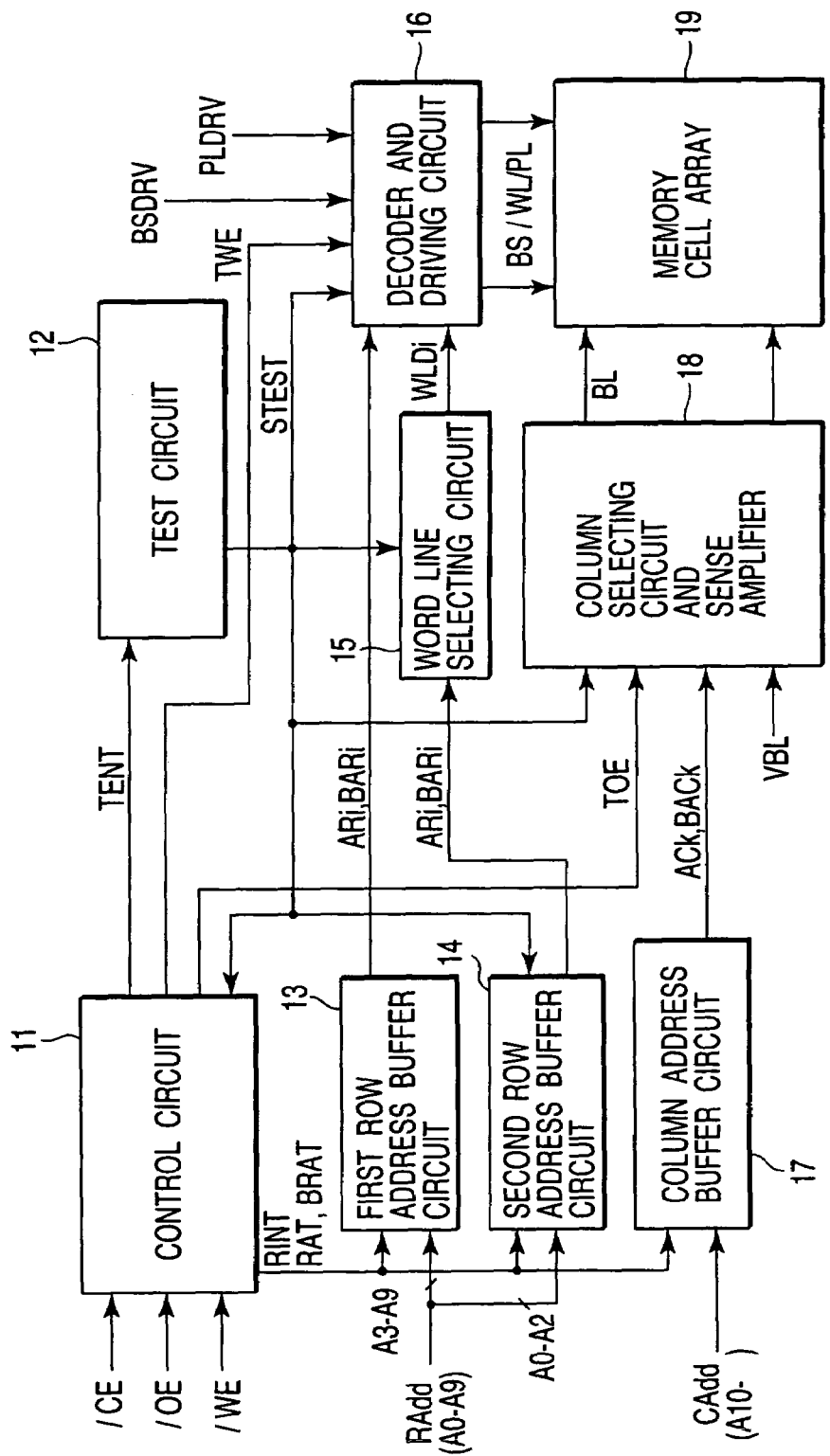
F I G. 2

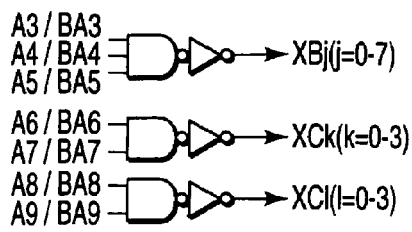
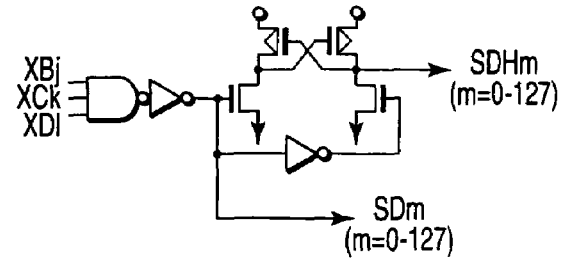
FIG. 7A   FIG. 7B
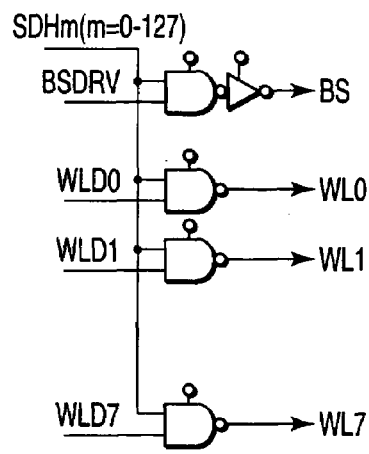
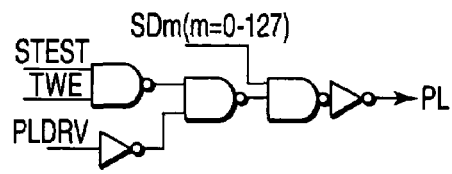
FIG. 7C   FIG. 7D

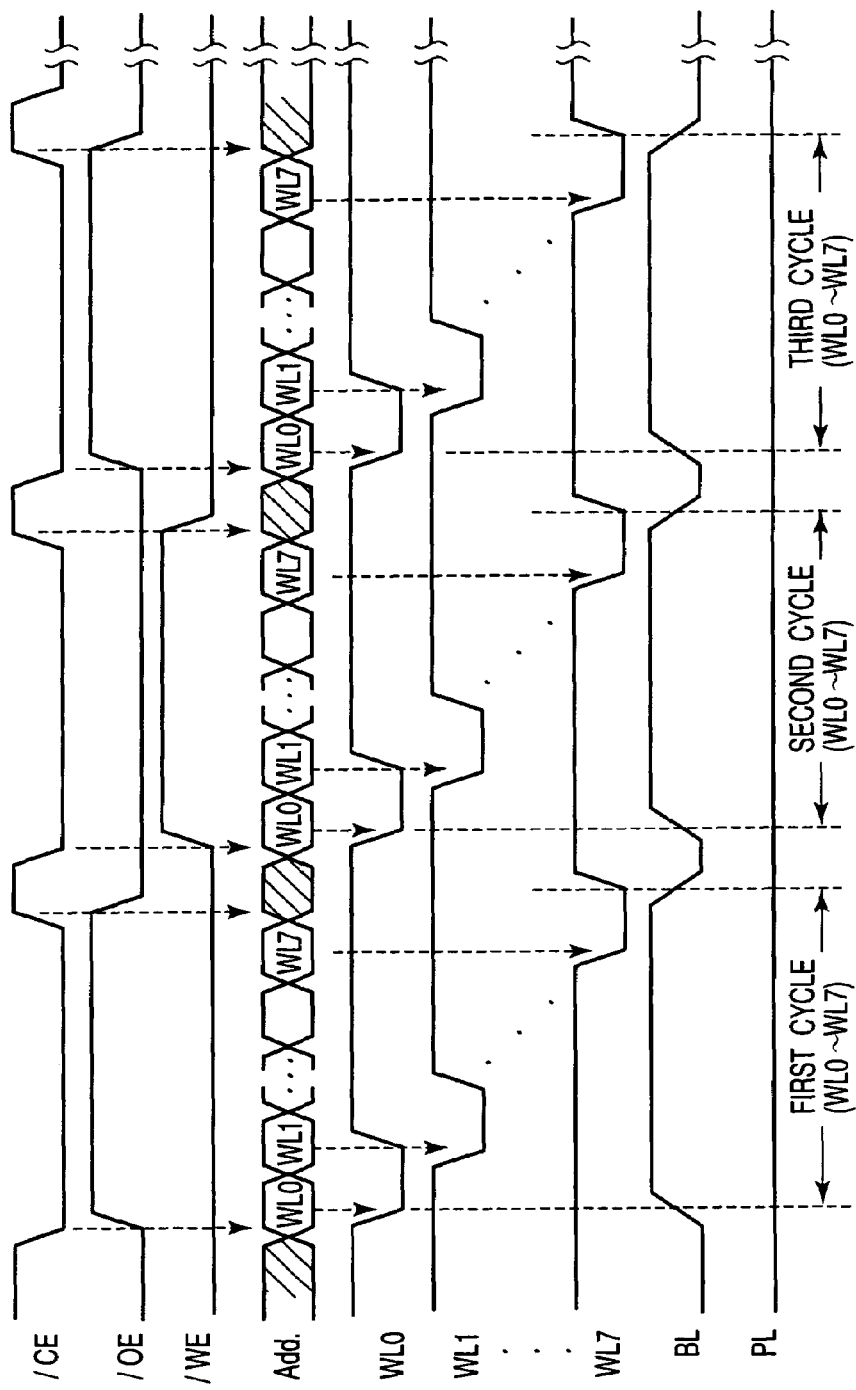
F I G. 12

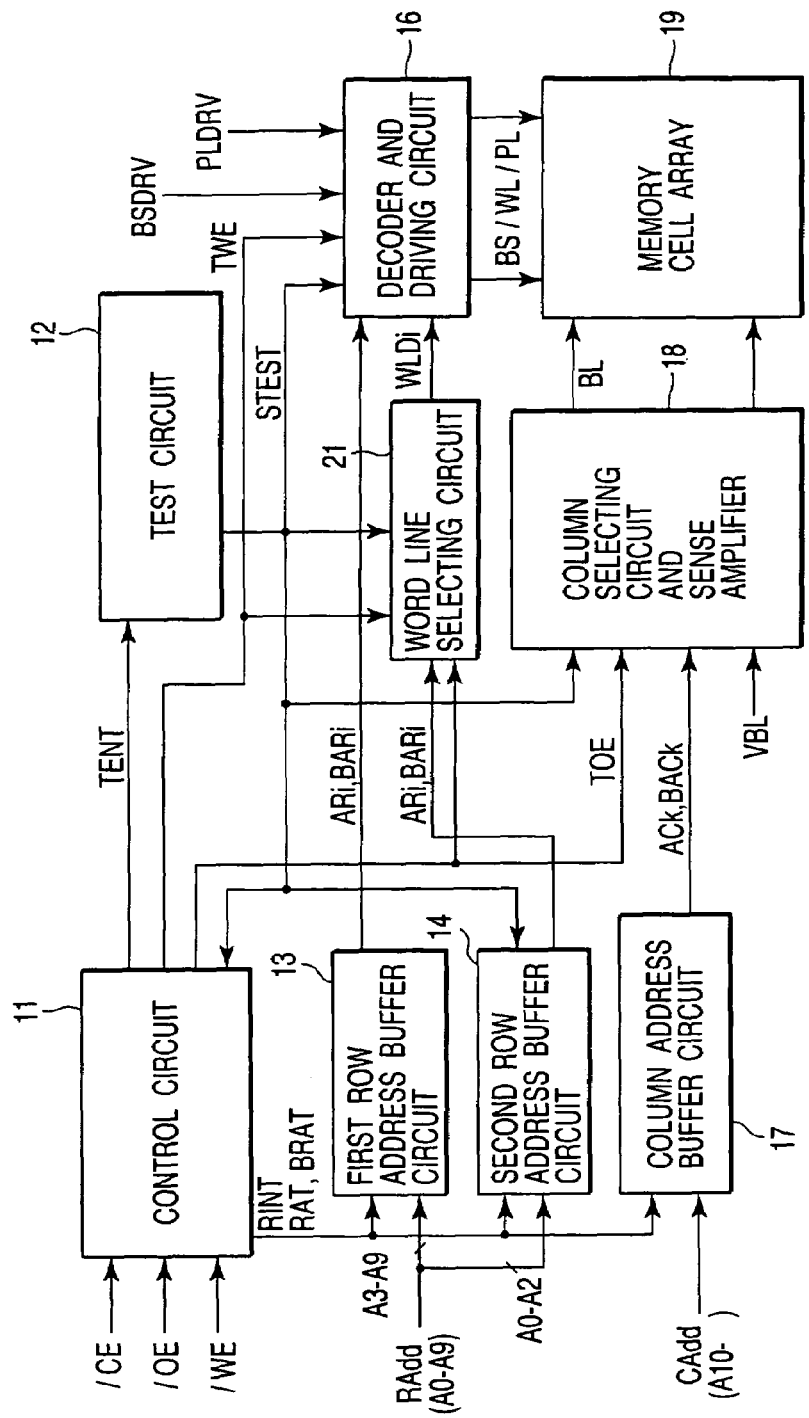
F I G. 14

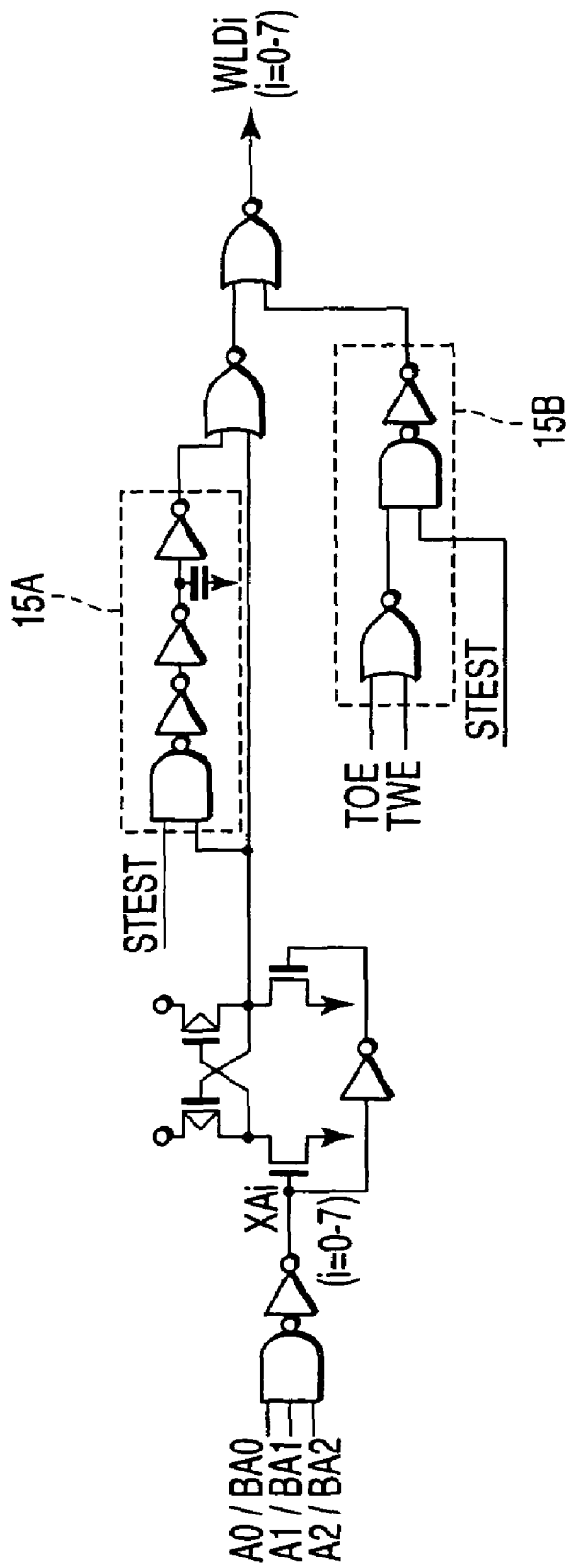
F I G. 15

INTEGRATED CIRCUIT DEVICE PROVIDED WITH SERIES-CONNECTED TC PARALLEL UNIT FERROELECTRIC MEMORY AND METHOD FOR TESTING THE SAME

CROSS-REFERENCE TO RELATED APPLICATIONS

This application is based upon and claims the benefit of priority from prior Japanese Patent Application No. 2004-278100, filed Sep. 24, 2004, the entire contents of which are incorporated herein by reference.

BACKGROUND OF THE INVENTION

1. Field of the Invention

The present invention relates to an integrated circuit device, and for example, a series-connected TC parallel unit ferroelectric memory which is one of a number of types of nonvolatile semiconductor memory devices.

2. Description of the Related Art

In recent years, a series-connected TC parallel unit ferroelectric memory has been noticed as a ferroelectric memory which is one of a number of types of nonvolatile semiconductor memory devices. The series-connected TC parallel unit ferroelectric memory includes unit cells (memory cells) in each of which a lower electrode and an upper electrode of a ferroelectric capacitor (C) are connected to the source and drain of each of cell transistors (T), respectively, and which are connected in series to each other.

A series-connected TC parallel unit ferroelectric memory is subjected to a fatigue test, which will be explained with reference to FIG. 1 which is a view for use in explaining the outline of the fatigue test oF the series-connected TC parallel unit ferroelectric memory.

The series-connected TC parallel unit ferroelectric memory comprises unit blocks (memory blocks) each of which comprises eight unit cells connected in series.

As a fatigue test of a ferroelectric capacitor C1, FIG. 1 shows a case where stress voltages having different levels are alternately applied to the both ends of the ferroelectric capacitor C1. To be more specific, stress voltages are applied between a bit line BL and a plate line PL, with a block selecting signal BS for selecting a unit block set at a high level (which will be hereinafter referred to as "H"), a voltage applied to word lines WL0 and WL2 to WL7 set at "H", and a voltage applied to a word line WL1 set at a low level (which will be hereinafter referred to as "L"). That is, an "H" or "L" voltage is applied to the bit line BL, an "L" or "H" voltage differing from the voltage applied to the bit line BL is applied to the plate line PL.

Since the voltage applied to the word lines WL0 and WL2 to WL7 is at "H", cell transistors T0 and T2 to T7 are turned on, and the both ends of each of ferroelectric capacitors C0 and C2 to C7 are short-circuited. Thus, the both ends of each of the ferroelectric capacitors C0 and C2 to C7 have the same potential, and no stress voltages are applied to the both ends of each ferroelectric capacitor. In the ferroelectric capacitor C1 to be tested, the voltage applied to the word line WL1 is at "L", and a cell transistor T1 is in the OFF state. Thus, the voltage applied to the bit line BL is applied to a node b of the ferroelectric capacitor C1, and the voltage applied to the plate line PL is applied to a node c of the ferroelectric capacitor C1. In this state, high and low voltages are alternately applied to the bit line BL, and also high and low voltages are alternately to the plate line PL. Thereby, high and low voltages are alternately applied to the both ends of the ferroelectric capacitor C1 to be tested, and a fatigue test is carried out (as disclosed in, e.g., Jpn. Pat. Appln. KOKAI Publication No. 2002-313100).

In the above conventional test, since during an active cycle, an address is latched, and the unit cell to be tested is fixed, it is necessary to change the voltages to be applied to the bit line BL and the plate line PL, which have relatively large parasitic capacitances. For example, in a 32-Mbits series-connected TC parallel unit ferroelectric memory, the capacitance of each of the plate lines PL is very small, compared with a ferroelectric memory in which the unit cells are not connected in series. However, even in the above series-connected TC parallel unit ferroelectric memory, each plate line PL has a parasitic capacitance of several hundred fF. Furthermore, each of the bit lines BL has a parasitic capacitance of 200 to 300 fF. It takes long time to charge/discharge such plate and bit lines having relatively large parasitic capacitances. As a result, when a high voltage is applied in an accelerated test, it also takes long time to set the voltage, and so the test takes a very long time. For example, in a fatigue test conducted in the manner shown in FIG. 1, an electric charge of 600 to 700 fF is needed in order to charge/discharge the plate line PL and bit line BL and reverse the polarization of the ferroelectric memory. In a fatigue test in which a stress voltage is applied $10^{10}$ times, if the voltages applied to the plate and bit lines change every microsecond, it takes about 24 hours to carry out a fatigue test on one specimen.

BRIEF SUMMARY OF THE INVENTION

An integrated circuit device according to a first aspect of the present invention comprises; a memory cell block comprising memory cells connected in series, the memory cell comprising a cell transistor including a gate which is connected to a word line, and a ferroelectric capacitor connected to terminals of the cell transistor; a word line selecting circuit which successively selects the word lines connected to the cell transistors in the memory cells in the memory cell block in response to address signals successively input from an outside of the device, during an active cycle; and a driving circuit which applies a given voltage between ends of a current path provided of the cell transistors in the memory cells in the memory cell block, during a time period for which the word lines connected to the cell transistors are successively selected by the word line selecting circuit.

An integrated circuit device according to a second aspect of the present invention comprises; a memory cell block comprising memory cells connected in series, the memory cell comprising a cell transistor including a gate which is connected to a word line, and a ferroelectric capacitor including electrodes connected to terminals of the cell transistor; a first address buffer circuit which latches an address signal and outputs the address signal, an address signal identifying one of the word lines connected to the cell transistors in the memory cell block, a second address buffer circuit which outputs the address signal without latching the address signal; a switching circuit which receives the address signals output from the first address buffer circuit and the second address buffer circuit, and then outputs the address signal output from the first address buffer circuit in a regular operation time in which one of writing and reading is performed, and outputs the address signal output from the second address buffer circuit in a test mode in which a test is carried out on the memory cells; a word line selecting circuit which selects the one of the word lines connected to the cell transistors, in response to the address signal output from the switching circuit; and a driving circuit which applies a given voltage between ends of a current path provided of the cell transistors in the memory cells in the memory cell block, during a time period in which the one of the word lines is selected in response to the address signal output from the second address buffer circuit.

A method according to a third aspect of the present invention, for testing an integrated circuit device which comprises a memory cell block comprising memory cells connected in series, the memory cell comprising a cell transistor including a gate which is connected to a word line, and a ferroelectric capacitor including electrodes connected to terminals of the cell transistor, the method comprising: turning off a first cell transistor of the cell transistors, which is included in a first memory cell of the memory cells in the memory cell block, and tuning on the other transistors of the cell transistors, which are included in the other memory cells; turning off a second cell transistor adjacent to the first cell transistor; turning on the first cell transistor after turning off the second cell transistor; and applying a given voltage between ends of a current path provided of the cell transistors in the memory cells in the memory cell block, from time the first cell transistor is turned off to time the first cell transistor is turned on.

BRIEF DESCRIPTION OF THE SEVERAL VIEWS OF THE DRAWING

FIG. 2 is a block diagram of the structure of a ferroelectric memory included in an integrated circuit device according to a first embodiment of the present invention.

FIGS. 7A, 7B, 7C and 7D are circuit diagrams showing the structure of a decoder and driving circuit in the ferroelectric memory in the first embodiment.

FIG. 12 is a timing chart showing an operation waveform at a dynamic imprint test of the ferroelectric memory in the first embodiment.

FIG. 14 is a block diagram of the structure of a ferroelectric memory included in an integrated circuit device according to a second embodiment of the present invention.

FIG. 15 is a circuit diagram of the structure of a word line selecting circuit in the ferroelectric memory in the second embodiment.

DETAILED DESCRIPTION OF THE INVENTION

Figure 1:
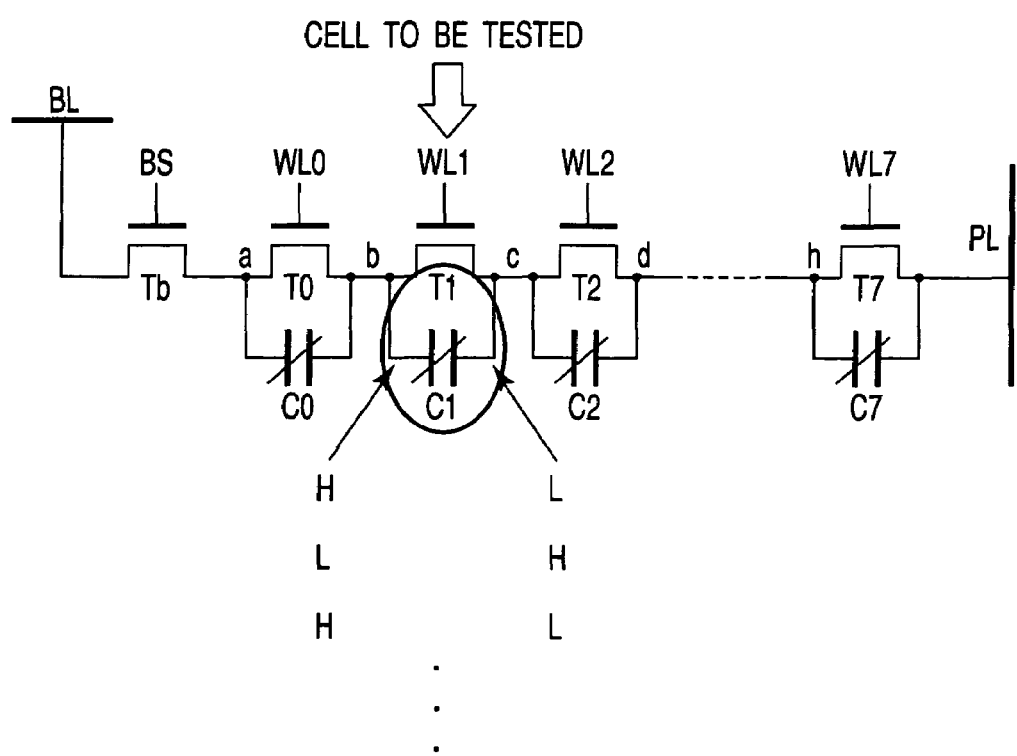
FIG. 1 is a view for use in explaining the outline of a fatigue test of a conventional series-connected TC parallel unit ferroelectric memory.

The embodiments of the present invention will be explained with reference to the accompanying drawings. In the following explanations, the same structural elements in the drawings will be denoted by the same reference numerals, respectively. In the following description, structural elements having the same functions and same structures will be denoted by the same reference numerals, respectively.

The First Embodiment

A ferroelectric memory in an integrated circuit device according to the first embodiment of the present invention will be explained.

FIG. 2 is a block diagram of the structure of the ferroelectric memory in the integrated circuit device according to the first embodiment. As shown in FIG. 2, the ferroelectric memory comprises a control circuit 11, a test circuit 12, a first row address buffer circuit 13, a second row address buffer circuit 14, a word line selecting circuit 15, a decoder and driving circuit 16, a column address buffer circuit 17, a column selecting circuit and sense amplifier 18 and a memory cell array 19.

The memory cell array has the following structure:

In each of unit cells (memory cells), an electrode at one of the ends of a ferroelectric capacitor is connected to the source of a cell transistor, and an electrode at the other end of the ferroelectric capacitor is connected to the drain of the cell transistor. A number of unit cells each having the above structure are connected in series to each other at their sources or drains, thereby forming a unit block (memory cell block). In this case, suppose eight unit cells are connected in series to form one unit block. A memory cell array 19 comprises a number of unit blocks.

The control circuit 11 controls the operation of each of the test circuit 12, the first row address buffer circuit 13, the second row address buffer circuit 14, the column address buffer 17, the decoder and driving circuit 16, the column selecting circuit and sense amplifier 18. For example, the control circuit 11 outputs a test entry signal TENT for use in setting the ferroeletric memory in a specific test mode to the test circuit 12 in response to a chip enable signal /CE, an output enable signal /OE and a write enable signal /WE, etc. In this case, suppose the test mode to be set is an operation mode of a fatigue test in which a stress voltage is applied to the ferroelectric capacitor of each memory cell.

The test circuit 12 receives the test entry signal TENT from the control circuit 11, and outputs a stress test signal STEST for giving an instruction for executing a fatigue test to the control circuit 11, the second row address buffer circuit 14, the word line selecting circuit 15, the decoder and driving circuit 16 and the column selecting circuit and sense amplifier 18 in response to the test entry signal TENT.

The control circuit 11 receives the stress signal STEST, and outputs a test signal TWE for setting the voltage of a plate line PL to the decoder and driving circuit, and also a test signal TOE for setting the voltage of a bit line BL, at the time of giving the fatigue test. Also, the control circuit 11 outputs a latching initializing signal RINT for initializing latching of an address signal, an address latch signal RAT for controlling a latched state of an address signal, and an address latch signal BRAT which is an inversion signal of the address latch signal RAT to the first row address buffer 13, the second row address buffer circuit 14 and the column address buffer circuit 17.

To the first row address buffer circuit 13, row address signal components A3–A9 of a row address signal RAdd (A0, A1, . . . A9) input from the outside of the device are input, and also the latching initializing signal RINT and the address latch signals RAT and BRAT are input as described above. The row address signal components A3–A9 designate a specific block in the memory cell array 19. The first row address buffer circuit 13 latches the row address signal components A3–A9, and then outputs row address signals Ari and BARi (i=3, 4, . . . 9) to the decoder and driving circuit 16.

The second row address buffer circuit 14 has a non-latching function of not latching the row address signal RAdd. To the second row address buffer circuit 14, row address components A0–A2 of the row address signal RAdd are input. The row address components A0–A2 designate a specific word line in a unit block. The second row address buffer 14 does not latch the row address signals RAdd, and outputs row address signals ARi and BARi (i=0, 1, 2) corresponding to the row address signals RAdd, when an instruction for executing a fatigue test is given by the stress test signal STEST.

The word line selecting circuit 15 selects a word line in response to the row address signals ARi and BARi (i=0, 1, 2), and outputs a word line driving signal WLDi (i=0, 1, . . . 7) for selecting the word line to the decoder and driving circuit 16. Furthermore, when the word line to be selected is changed at the time of carrying out a stress test, the word line selecting circuit 15 sets the timing at which the word line is set in a non-selected state ("H" state), such that the timing lags by a given time period with respect to that in a regular operation time. That is, the word line selecting circuit 15 sets driving timings of word lines such that those at a fatigue test time are different from those at a regular operation time, and also sets a number of word lines in a selected state ("L" state) for a given time period such that not all the cell transistors are in the ON state at a word line switching time, i.e., the time of switching the word line to be selected, at the fatigue test time.

The decoder and driving circuit 16 drives word lines WL0 to WL7 in response to the word line driving signal WLDi (i=0, 1, . . . 7). Also, the decoder and driving circuit 16 receives the row address signals ARi and BARi (i=3, 4, . . . 9) from the first row address buffer circuit 13, and drives a block selecting line BS and a plate PL, while using the row address signals ARi and BARi as decoding signals.

To the column address buffer circuit 17, column address signal CAdd (A10, . . . ) is input from the outside of the device, and the latching initializing signal RINT and the address latch signals RAT and BRAT are input from the control signal 11. As a result, after latching the column address signals CAdd, the column address buffer circuit 17 outputs a column address signal ACk and a column address signal BACk which is an inversion signal of the column address signal Ack, to the column selecting circuit and the sense amplifier 18. The column selecting circuit and sense amplifier 18 drives a bit line BL based on the column address signals ACk and BACk, the stress test signal STEST, the test signal TOE and a bit line input voltage VBL.

Examples of the structures of the control circuit 11, the first row address buffer circuit 13, the second row address buffer circuit 14, the word line selecting circuit 15 and the decoder and driving circuit 16 will be explained.

Figure 3A:
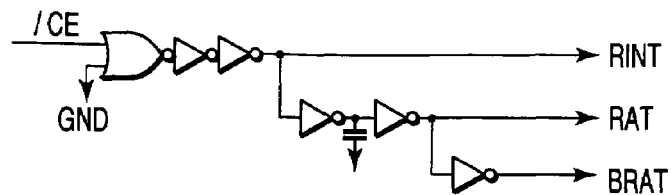
FIGS. 3A, 3B and 3C are circuit diagrams showing the structure of a control circuit in the ferroelectric memory in the first embodiment.
Figure 3B:
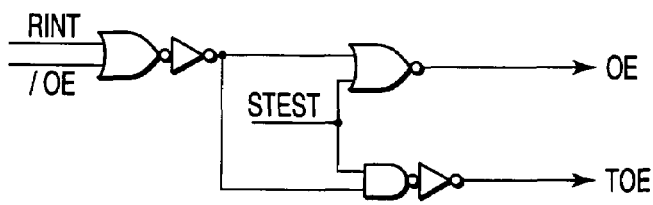
Figure 3C:
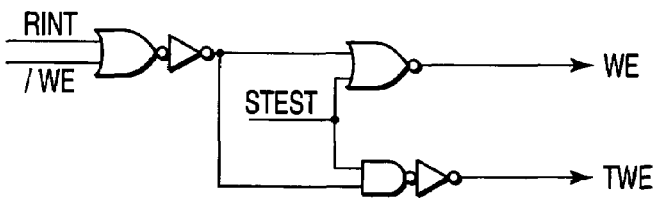

FIGS. 3A, 3B and 3C are circuit diagrams showing the structure of the control circuit 11. The control circuit 11 includes a chip enable signal buffer portion shown in FIG. 3A, an output enable signal buffer portion shown in FIG. 3B and a write enable signal buffer portion shown in FIG. 3C.

The chip enable signal buffer portion, as shown in FIG. 3, receives the chip enable signal /CE, and outputs the latching initializing signal RINT and the address latch signals RAT and BRAT. The output enable signal buffer portion, as shown in FIG. 3B, receives the output enable signal /OE input from the outside of the device, the latching initializing signal RINT and the stress test signal STEST, and outputs an internal signal OE and the test signal TOE. The write enable signal buffer portion, as shown in FIG. 3C, receives the write enable signal /WE, the latching initializing signal RINT and the stress test signal STEST from the outside of the device, and outputs an internal signal WE and a test signal TWE.

Figure 4:
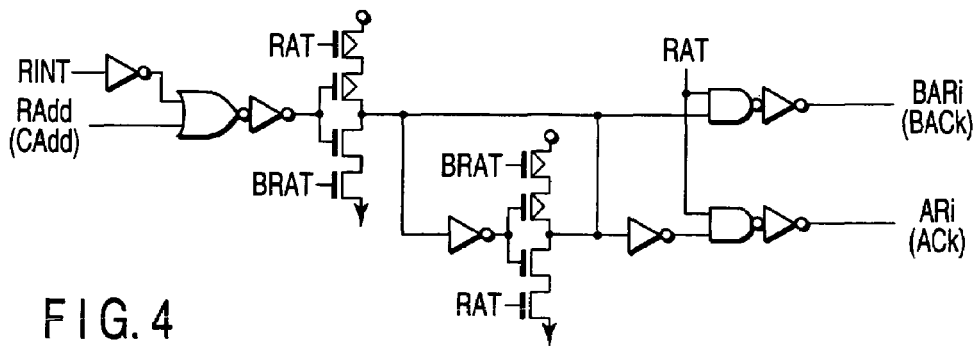
FIG. 4 is a circuit diagram of the structures of a first row address buffer circuit and a column address buffer circuit in the ferroelectric memory in the first embodiment.

FIG. 4 is a circuit diagram of the structures of the first row address buffer circuit 13 and the column address buffer circuit 17.

To the first address buffer circuit 13, as described above, the row address signal RAdd (A3–A9), the latching initializing signal RINT and the address latch signals RAT and BRAT are input. The first row address buffer circuit 13 outputs the row address signals ARi and BARi (i=3, 4, . . . 9) in response to the row address signal RAdd (A3–A9).

To the column address buffer circuit 17, the column address signals CAdd (A10, . . . ), the latching initializing signal RINT and the address latch signals RAT and BRAT are input. The column address buffer circuit 17 outputs column address signals ACk and BACk for giving an instruction for selecting a bit line in a unit block in response to the column address signal CAdd (A10, . . . ).

The first row address buffer circuit 13 and the column address buffer circuit 17 are activated when the latching initializing signal RINT is at "H", and they are in a non-latching state in which they do not latch the row address signal RAdd (or column address signal CAdd), when the address latch signal RAT is at "L", and the address latch signal BRAT is at "H". Thereby, row address signals ARi and BARi (or column address signals ACk and BACk) are output in response to the row address signal RAdd (or column address signal CAdd). Furthermore, when the address latch signal RAT is at "H", and the address latch signal BRAT is at "L", the first row address buffer circuit 13 and the column address buffer circuit 17 are in a latching state in which they latch the row address signals RAdd (or column address signals CAdd), thus maintaining a state in which the address latch signal RAT varies from "L" to "H".

Figure 5:
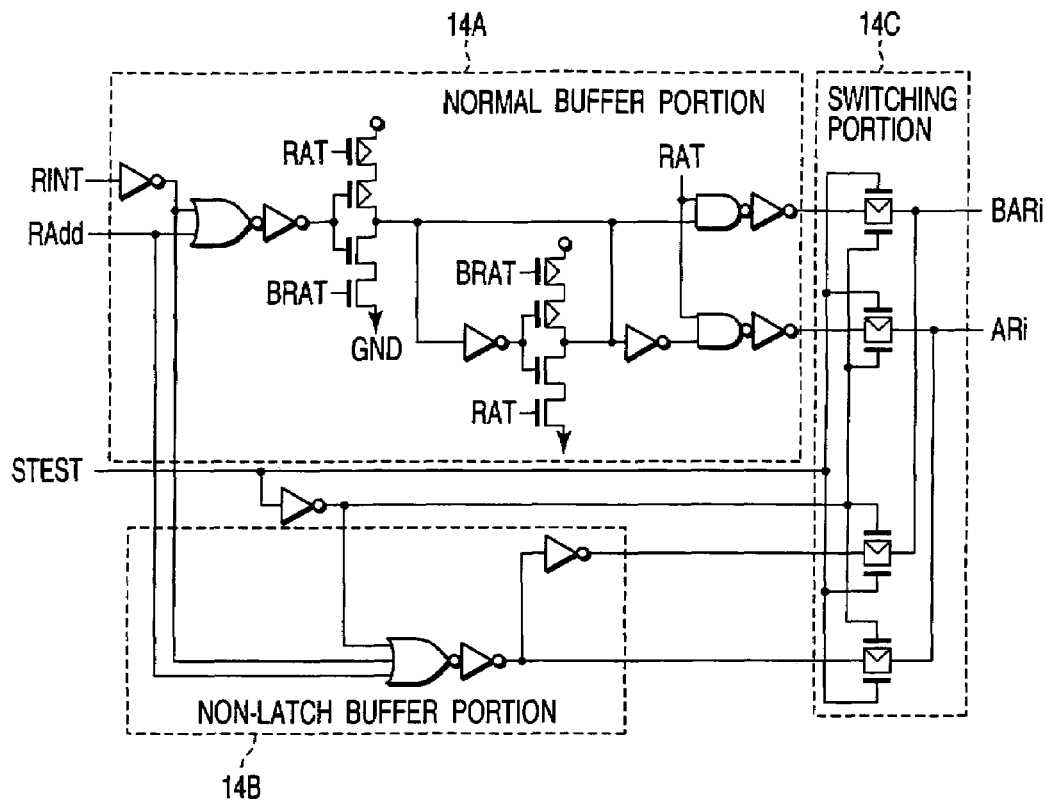
FIG. 5 is a circuit diagram of the structure of a second ferroelectric memory in the first embodiment.

FIG. 5 is a circuit diagram of the structure of the second row address buffer circuit 14. The second row address buffer circuit 14 includes a non-latch buffer portion 14B and a switching portion 14C, in addition to the first row address buffer circuit 13 (normal buffer portion 14A) shown in FIG. 4. The normal buffer portion 14A has the same structure as the first row address buffer 13 shown in FIG. 4. When the stress test signal STEST is at "H", the non-latch buffer portion 14B is activated, and outputs row address signals ARi and BARi (i=0, 1, 2) in response to the row address signal RAdd. The switching portion 14C functions as effecting switching between outputting of the normal buffer portion 14A and that of the non-latch buffer portion 14B. To be more specific, at the normal operation time, i.e., when the stress test signal STEST is at "L", the output of the normal buffer portion 14A is output as the row address signals ARi and BARi (i=0, 1, 2), and at the fatigue test time, i.e., when the stress test signal STEST is at "H", the output of the non-latch buffer portion 14B is output as the row address signals ARi and BARi. Also, as stated above, to the second row address buffer 14, row address signals A0–A2 for selecting eight word lines are input, and to the first row address buffer circuit 13, row address signals A3–A9 are input.

In the second row address buffer circuit 14, at the normal operation time, the stress test signal STEST becomes "L", and row address signals ARi and BARi (i=0, 1, 2) latched by the address latch signals RAT and BRAT are output. At the fatigue test time, the stress test signal STEST becomes "H", and address signals ARi and BARi are output in response to the row address signal RAdd regardless of the states of the address latch signals RAT and BRAT.

Figure 6:
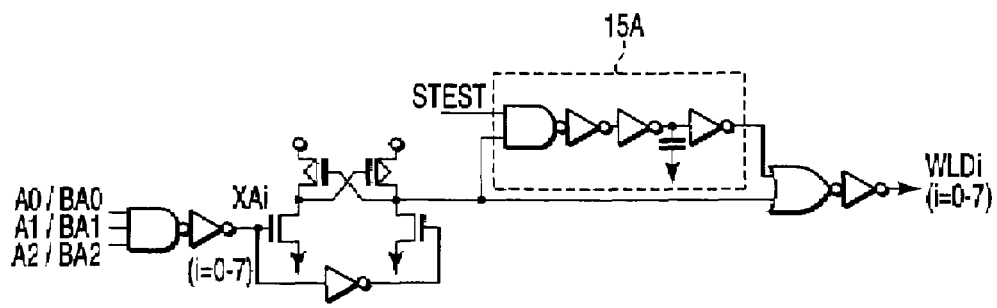
FIG. 6 is a circuit diagram of the structure of a word line selecting circuit in the ferroelectric memory in the first embodiment.

FIG. 6 is a circuit diagram of the structure of the word line selecting circuit 15. To the word line selecting circuit 15 shown in FIG. 6, A0/BA0, A1/BA1 and A2/BA2 are input as the row address signals ARi and BARi (i=0, 1, 2). The word line selecting circuit 15 outputs a word line driving signal WLDi for selecting a word line to the decoder and driving circuit 16 in response to the row address signal. Also, the word line selecting circuit 15 includes a delay circuit 15A for delaying the word line driving signal WLDi at the fatigue test time, i.e., when the stress test signal STEST is "H". Thereby, the word line selecting circuit 15 is set such that the timing at which a selected word line rises from "L" to "H" lags by a given time period.

FIGS. 7A to 7D show the structure of the decoder and driving circuit 16. The decoder and driving circuit 16 includes a block selecting circuit, a word line driving circuit and a plate line driving circuit. To the decoder and driving circuit 16, the row address signals ARi and BARi (i=3, 4, ... 9), the word line driving signal WLDi (i=0, 1, ... 7), the stress test signal STEST, the test signal TWE, a block selecting and driving signal BSDRV and a plate line driving signal PLDRV are input. Thereby, the decoder and driving circuit 16 outputs a driving signal to a block selecting line BS, a word line WL and a plate line PL.

Figure 8:
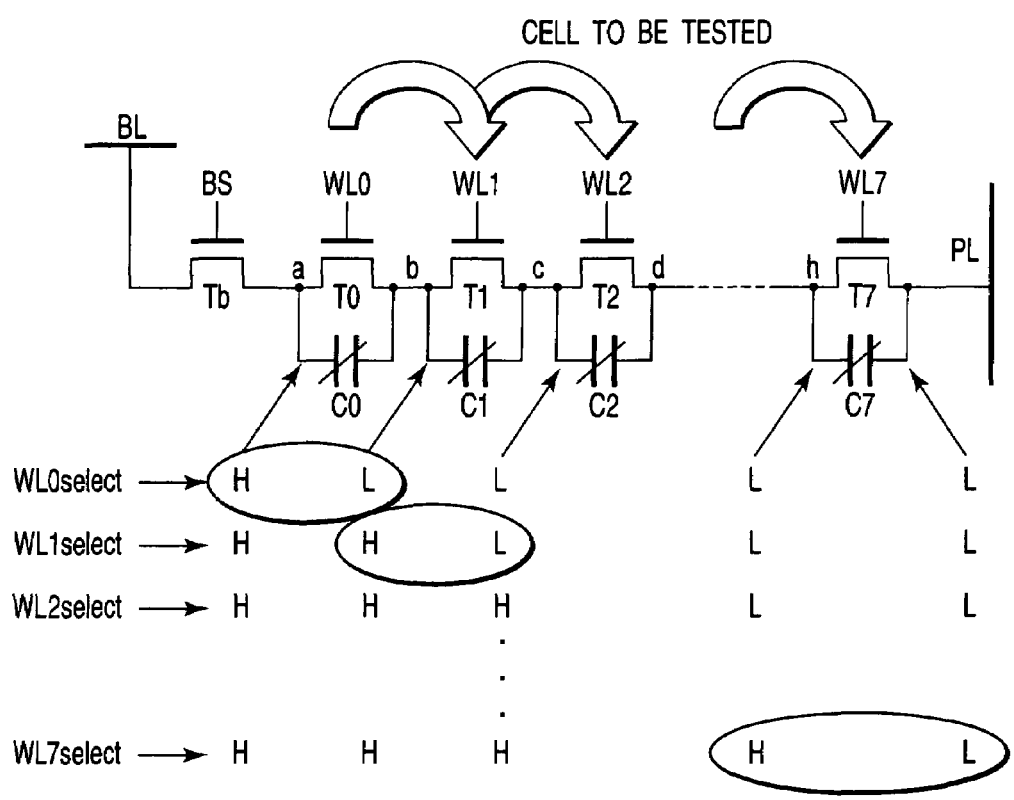
FIG. 8 is a view for illustrating the outline of the operation of the ferroelectric memory in the first embodiment.

The outline of the operation of the ferroelectric memory in the first embodiment will be explained with reference to FIG. 8. FIG. 8 is a view for use in explaining the outline of the operation of the ferroelectric memory in the first embodiment, and also shows a unit block in a series-connected TC parallel unit ferroelectric memory and applied states of stress voltages.

In each of unit cells, electrodes at the ends of a ferroelectric capacitor C0 are connected to the source and drain of a cell transistor T0, respectively. In the same manner, electrodes at the ends of ferroelectric capacitors C1 to C7 are respectively connected to the sources and drains of cell transistors T1 to T7, forming respective unit cells. Then, eight unit cells each having the above structure are connected in series at sources or drains, forming a unit block. Furthermore, word lines WL0 to WL7 are connected to the gates of cell transistors T0 to T7, respectively.

A unit cell comprising the cell transistor T0 and the ferroelectric capacitor C0 is connected to a bit line BL by a block selecting transistor Tb. To the gate of the block selecting transistor Tb, the block selecting signal BS is input. The block selecting transistor Tb sets the above unit block in the selected or non-selected state by using the block selecting line BS. Furthermore, a unit cell comprising the cell transistor T7 and the ferroelectric capacitor C7 is connected to a plate line PL.

First, the block selecting line BS is set to be "H", turning on the block selecting transistor Tb to select a unit block. Also, a word line WL0 connected to a unit cell to be tested is set to be "L", turning off the cell transistor T0 (i.e., setting it in the selected state). Furthermore, the remaining word lines, i.e., word lines WL1 to WL7, are set to be "H", turning on the cell transistors T1 to T7 (i.e., setting them in the non-selected state). In this state, stress voltages are applied between the plate line PL and bit line BL. That is, the voltage of the bit line BL is set to be high (e.g., "H"), and that of the plate voltage is set to be low (e.g., "L").

As stated above, when the voltage to the word line WL0 goes "L", the cell transistor T0 is turned off, thus isolating the ferroelectric capacitor C0. In this case, in the case where a high voltage is applied to the bit line BL, and a low voltage is applied to the plate line PL, high and low stress voltages ("H" and "L") are applied to the both ends of the ferroelectric capacitor C0 (i.e., BL side and PL side), respectively. At this time, the both ends of each of the ferroelectric capacitors C1 to C7 to be selected by the word lines WL1 to WL7 are short-circuited, since the cell transistors T1 to T7 are in the ON state. Therefore, the voltages applied to the both ends of each of the ferroelectric capacitors C1 to C7 are the same as the low voltage to the plate line PL, and no stress voltages are applied to the ferroelectric capacitors C1 to C7.

Next, the word line WL1 is set at "L", and the cell transistor T1 is set in the OFF state (selected state). Then, the word line WL0 is set at "H", and the cell transistor. T0 is set in the ON state (non-selected state). Thereby, the unit cell to be tested is changed from the above unit cell to a unit cell connected to the word line WL1. That is, the capacitor to which a stress voltage is to be applied is changed from the capacitor C0 to the capacitor C1. As a result, the voltages to the both ends of the capacitor C0 become "H" (which are the same as that to the bit line BL), since the cell transistor T0 is turned on as stated above. Consequently, application of the stress voltage to the ferroelectric capacitor C0 ends.

Furthermore, in the ferroelectric capacitor C1 to be tested, the potential at a node b close to the ferroelectric capacitor C0 is changed from "L" to "H", and that at a node c is kept at "L". Thus, a stress voltage is applied to the ferroelectric capacitor C1. The states of the ferroelectric capacitors C2 to C7 remain unchanged. Thus, no stress voltages are applied to the ferroelectric capacitors C2 to C7.

In such a manner, in one active cycle, the word lines WL0 to WL7 are successively set at "L" in this order, whereby stress voltages are applied to the ferroelectric capacitors C0 to C7 in this order.

When reversion of polarization of the ferroelectric capacitor, which is caused by the above-mentioned switching the word line to be selected, can be achieved by charging/discharging the ferroelectric capacitor, the electric charge to be imported to or discharged from the ferroelectric capacitor is approximately one quarter that involved in charging/discharging the plate line or bit line. Thus, in the fatigue test, the time required for charging/discharging can be greatly shortened. Accordingly, the time required for the fatigue test can be shortened.

In the first embodiment, the buffer circuit 14 is provided, and does not latch row address signals in an active cycle in which a chip enable signal /CE is at "L". Thus, an arbitrary one of the word lines WL0 to WL7 can be selected by a row address signal input from the outside of the device. By virtue of this feature, the word lines WL0 to WL7 can be successively selected. Furthermore, at the fatigue test time, the timing of driving a word line is changed to be different from that at a regular operation time, so that not all the cell transistors are in the ON state at the time of switching the word line to be selected.

Figure 9:
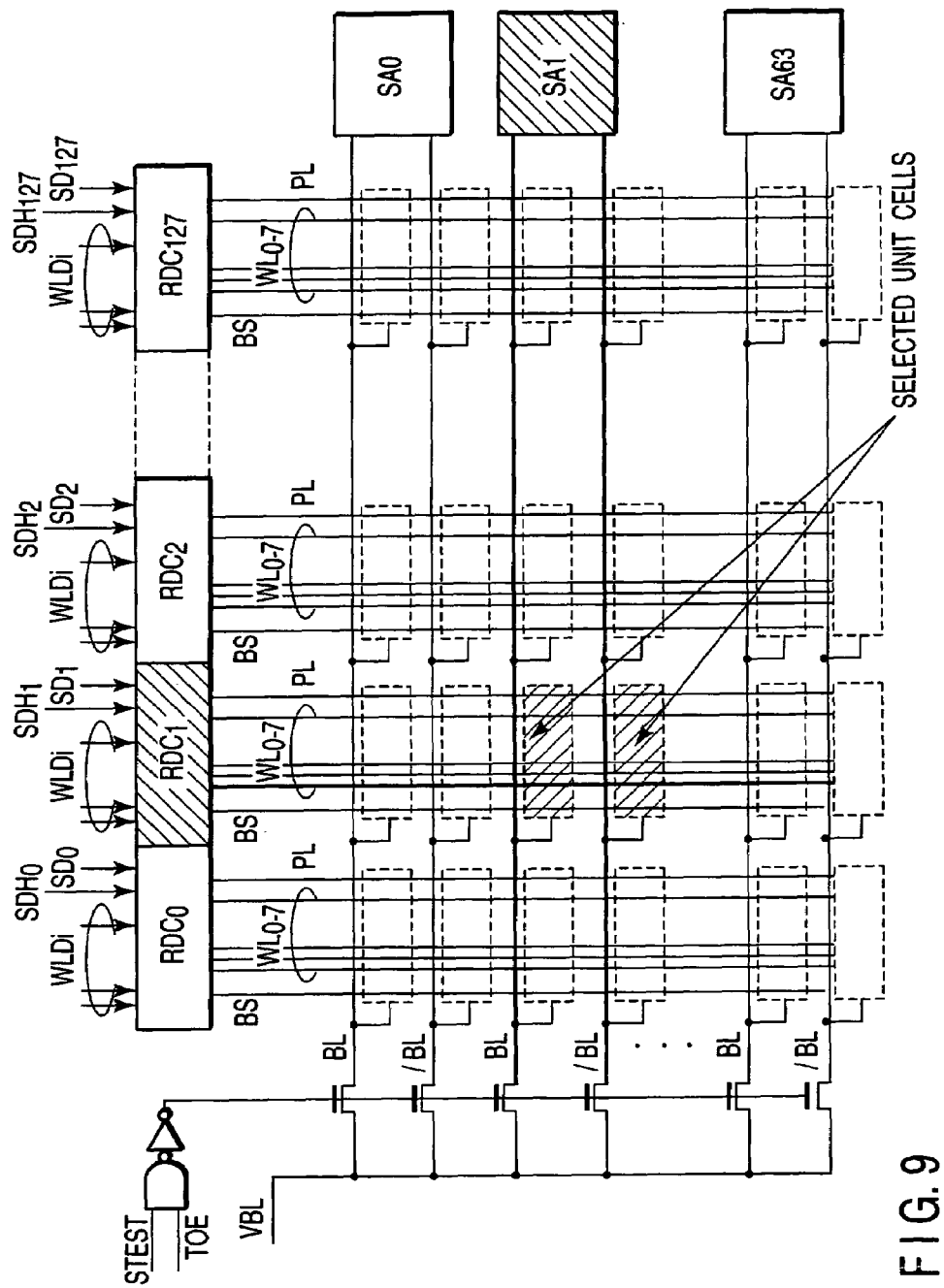
FIG. 9 is a conceptual diagram showing that unit cells are in a selected state at a regular operation time in the ferroelectric memory in the first embodiment.

FIG. 9 is a conceptual diagram showing that unit cells are in the selected state at the regular operation time in the ferroelectric memory in the first embodiment. In the example shown in FIG. 9, of 128 row decoders RDC0 to RDC127, a row decoder RDC1 is selected. Furthermore, of 8 word lines WL0 to WL7 connected to the row decoder RDC1, the word line WL0 is selected. In column decoders, 64 sense amplifiers SA0 to SA63, a pair of bit lines BL and /BL connected to the sense amplifier SA1 are selected. In FIG. 9, the selected word line WL0 and pair of bit lines BL and /BL are indicated by bold lines, and the selected row decoder RDC1, sense amplifier SA1 and unit cell are hatched.

Figure 10:
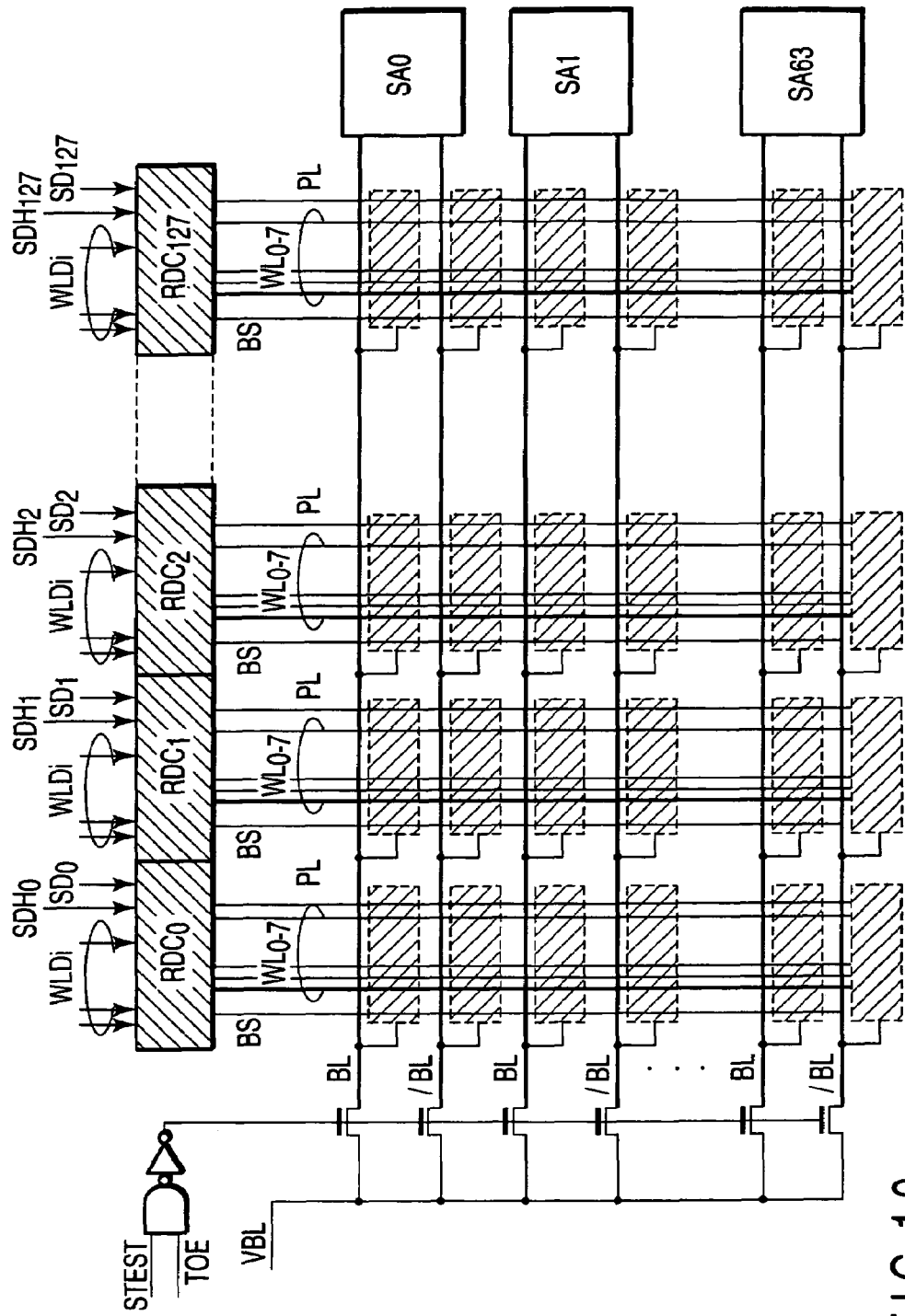
FIG. 10 is a conceptual diagram showing that unit cells are in a selected state at time of a fatigue test in the ferroelectric memory in the first embodiment.

FIG. 10 is a conceptual diagram showing that unit cells are selected at the fatigue test time in the ferroelectric memory in the first embodiment. At the fatigue test time, all the 128 row decoders RDC0 to RDC127 are selected, and all the pairs of bit lines BL and /BL are selected. Furthermore, the eight word lines WL0 to WL7 connected to each of the row decoders RDC0 to RDC127 are successively selected in this order. FIG. 10 shows a state in which all the word lines WL0 are selected. However, at the fatigue test time, the sense amplifiers SA0 to SA63 are in a non-activated state.

Next, the fatigue test of the ferroelectric memory in the first embodiment will be explained in detail.

Figure 11:
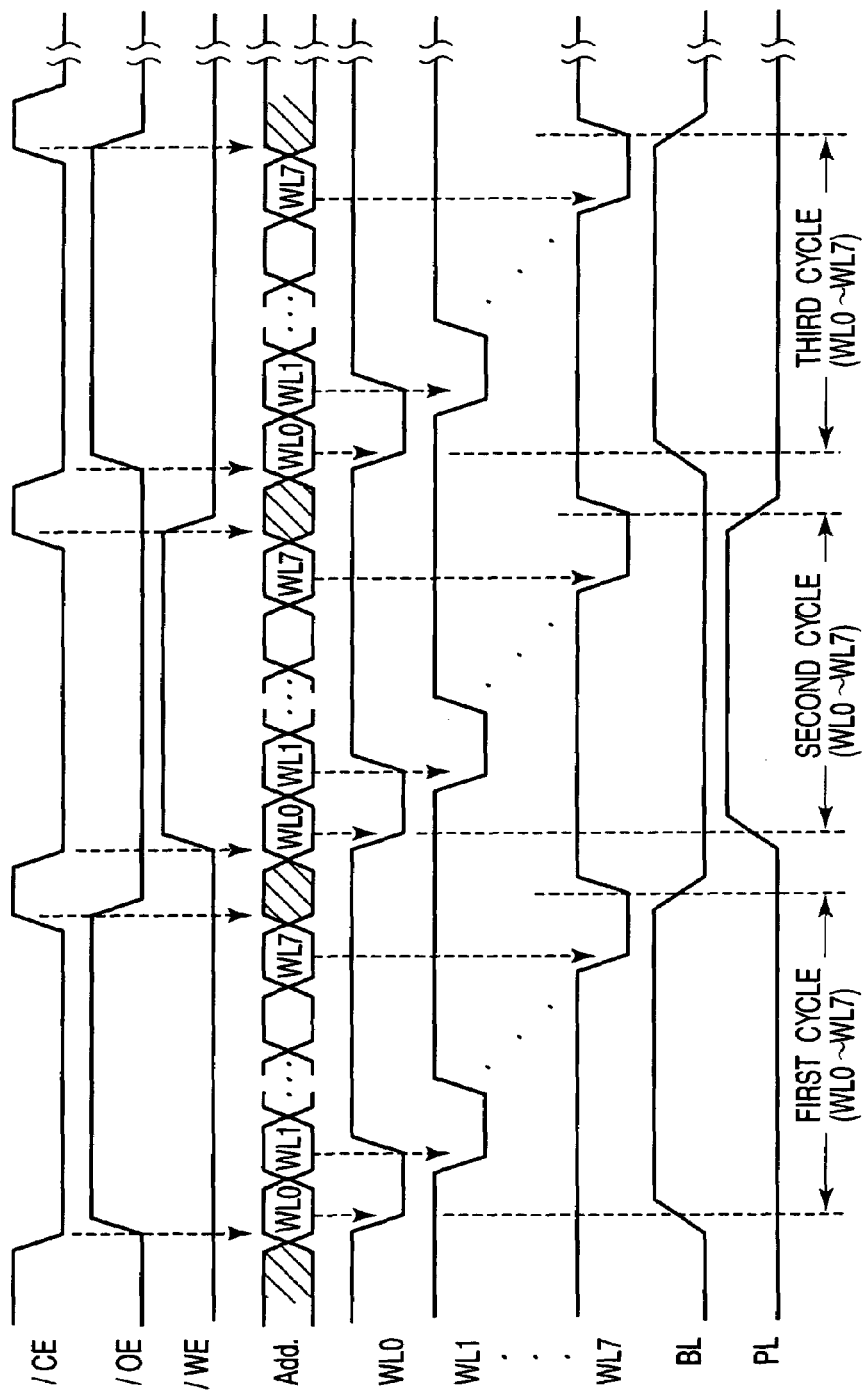
FIG. 11 is a timing chart showing an operation waveform at the fatigue test in the ferroelectric memory in the first embodiment.

FIG. 11 is a timing chart showing an operation waveform at the fatigue test in the ferroelectric memory in the first embodiment. In a conventional device, a selected word line is fixed in an active cycle in which the chip enable signal /CE is at "L", whereas in the first embodiment of the present invention, the voltage to be applied to each of eight word lines in a unit block can be selected by a row address signal input from the outside of the device. The timing of applying voltages to the bit line BL and the plate line PL is controlled by adjusting the timing of driving an output enable signal /OE and a write enable signal /WE, which are input from the outside of the device.

In a first cycle illustrated in FIG. 11, the output enable signal /OE and the write enable signal /WE are set at "H" and "L", respectively, such that the voltages to be applied to the bit line BL and the plate line PL are high ("H") and low ("L") voltages, respectively. Selecting ("L") and non-selecting ("H") of the eight word lines WL0 to WL7 are controlled with an address expressed by three bits, e.g., A0, A1 and A3. At an active time at which the chip enable signal /CE is at "L", one of the word lines WL0 to WL7 is selected, that is, at the active time, the "L" voltage is applied to one of the word lines WL0 to WL7. As a result, a unit cell connected to the word line to which the "L" voltage is applied is tested.

In the case of successively selecting the word lines, with respect to the unit cells connected in series to each other, it is necessary that the word lines are successively selected from the word line WL0 to the word line WL7 or from the word line WL7 to the word line WL0, that is, they are successively selected from one of the outermost ones of them. For example, by sequentially selecting the word lines WL0, then WL1, then WL2, etc., as shown in FIG. 8, an "H" voltage applied to a bit line BL is applied to the nodes a, then b, then c, etc, and so a stress voltage is applied to the ferroelectric capacitors C0, then C1, then C2, etc.

In a second cycle, the output enable signal /OE and the write enable signal /WE are set at "H" and "L", respectively, so that the "L" and "H" voltages are applied to the bit line BL and plate line PL, respectively. In a third cycle, the output enable signal /OE and the write enable signal /WE are set at "L" and "H", respectively, so that the "H" and "L" voltages are applied to the bit line BL and plate line PL, respectively. In such a manner, each time the active cycle is changed, each of the voltages to be applied to the bit line BL and plate line PL is changed from one of the "H" and "L" voltages to the other such that they are different in each cycle. In the second and third cycles, the word lines WL0 to WL7 are successively selected in the same manner as in the first cycle.

The timing of selecting a word line with the word line selecting circuit 15 is set such that the timing at which the voltage to a word line WL being in the selected state raises from "L" to "H" lags with respect to that at a regular reading operation time or writing operation time. Thus, the timing of switching the word line to be selected is adjusted such that the voltage to the above word line is kept at "L" for a given time period, after the voltage to be applied to a word line WL subsequent to the above word line WL is changed to the "L" voltage. That is, the above two word lines WL, i.e., the currently selected word line WL and the precedently selected word line WL, are temporarily both set in the selected state ("L").

It should be noted that in the regular operation, when the address of the word line to be selected is changed, a selected word line and a non-selected word line are respectively set in the non-selected state and in the selected state at substantially the same timing.

In this case, according to the first embodiment, in the case where the threshold value of each of the cell transistors is low, when the voltage to a word line to be set in the non-selected state ("H") becomes slightly high, a cell transistor connected to the word line is turned on, and when the voltage to a word line to be set in the selected state "L" becomes slightly low, a cell transistor connected to the word line is also still in the ON state, as a result of which there is a possibility that those two cell transistors may be both in the ON state. In this case, the cell transistors other than the two cell transistors to be tested are all in the non-selected state and in the ON state. That is, the eight cell transistors are all in the ON state.

In such a manner, when all the cell transistors become in the ON state, bit lines BL and plate lines PL are short-circuited, an a leak current flows, thus changing the voltage. Consequently, current is wasted, and it takes a long time to set the voltages to the bit line BL and the plate line PL to be high, further worsening the efficiency of the test. In view of this point, in order that one of the eight cell transistors be necessarily made in the OFF state, the timing of driving the word lines is set to ensure that two cell transistors are temporarily both in the OFF state.

Furthermore, in the first embodiment, after a stress voltage is applied to each of the eight memory cells in the unit block, the "H" voltage is applied to all the word lines WL0 to WL7, the "L" voltage is applied to the bit line BL, and also the "L" voltage is applied to the plate line PL. This is intended to equalize the time periods for which stress voltages are applied to the memory cells respectively selected by the word lines. In addition, when the "L" voltage is applied to the bit line BL and the plate line PL, the bit line BL or plate line PL, to which the "H" voltage was applied, is rapidly discharged. Thereby, the time required for the fatigue test can be further shortened.

Next, dynamic imprint tests of the ferroelectric memory in the first embodiment will be explained.

Figure 13:
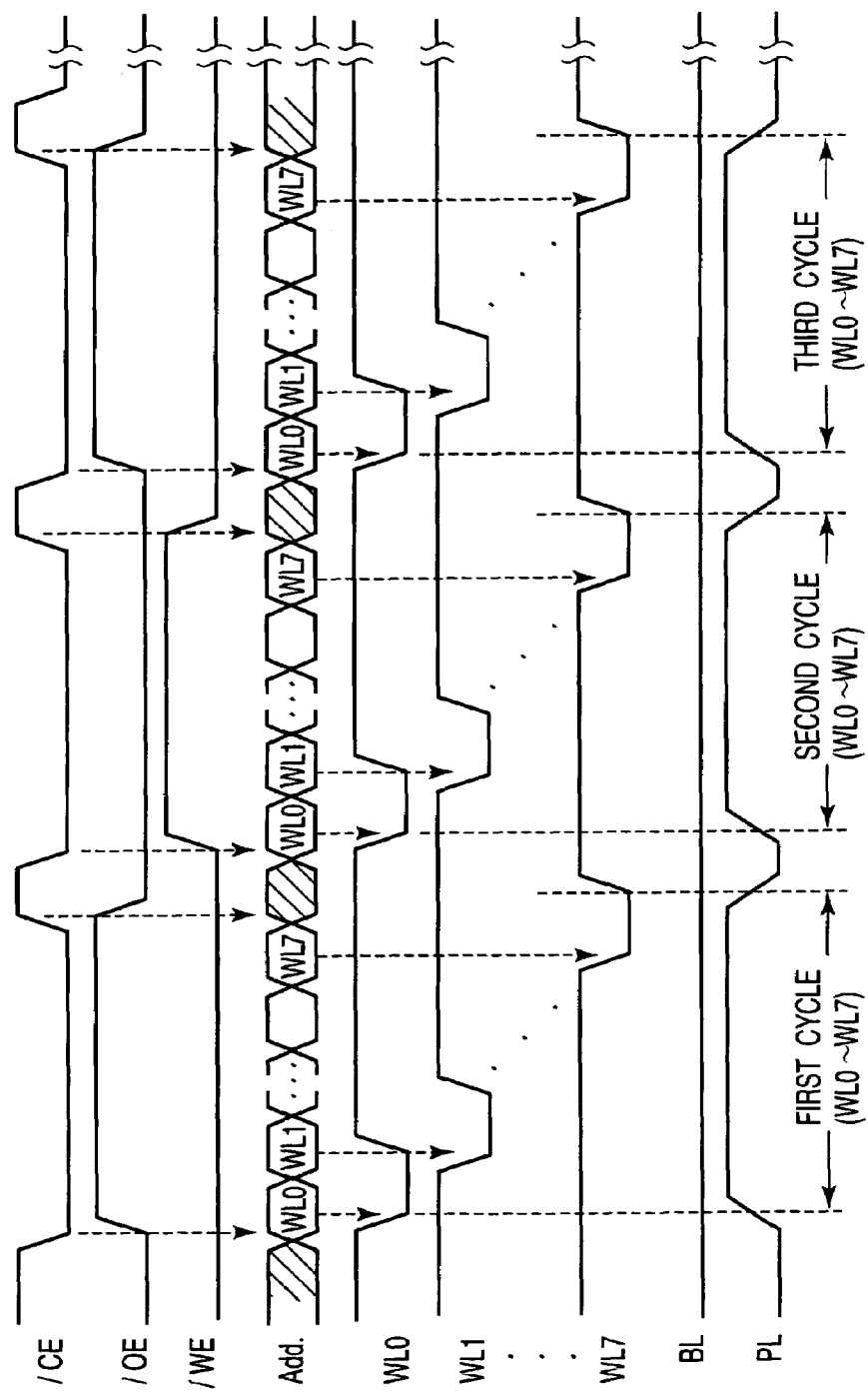
FIG. 13 is a timing chart showing an operation waveform in another dynamic imprint test of the ferroelectric memory in the first embodiment.

FIGS. 12 and 13 are timing charts showing operation waveforms in the dynamic imprint tests of the ferroelectric memory in the first embodiment.

In each of the dynamic imprint tests, a stress voltage is repeatedly applied to the ferroelectric capacitor without reversing the polarization thereof. In this case, when it is applied to the ferroelectric capacitor, its electric field is not changed. FIG. 12 shows an operation waveform in the case where a high voltage ("H") and a low voltage ("L") are respectively applied to the bit line BL side and plate line PL side of a unit cell to be tested. In this operation, since the "H" voltage is applied to the bit line BL, the timing of applying the voltage is controlled by the output enable signal /OE. In the first cycle, the "L" and "H" voltages are applied to the plate line PL and bit line BL, respectively, and a stress voltage is successively applied to the eight unit cells in a unit block.

In the first cycle, when a stress voltage is applied to the eight unit cells (ferroelectric capacitor), the "L" voltage is once applied to the bit line BL, and the "H" voltage is applied to all the word lines WL. Subsequently, in the second cycle, a stress application is applied in the same manner as in the first cycle. This is repeated in the third cycle, then the fourth cycle, then the fifth cycle, etc.

In the dynamic imprint test also, the word lines are successively from the word line WL0 to the word line WL7 or from the word line WL7 to the word line WL0, whereby at a dynamic imprint time, a stress voltage can be applied to all the unit cells.

FIG. 13 is a timing chart showing an operation waveform in the case where a low voltage and a high voltage are applied to the bit line BL side and plate line PL side of the unit cell to be tested. In this operation, in order that an "H" voltage be applied to a plate line PL, the timing of applying a voltage is controlled by a write enable signal /WE. The other operations are the same as those in FIG. 12.

As explained above, in the first embodiment, during one active cycle, voltages applied to the plate and bit lines are fixed, and the memory cells are successively selected, and a stress voltage is applied to a selected memory cell. This can shorten the time required for charging/discharging the plate and bit lines, and also the time for the test, compared with a test method in which during one active cycle, the memory cell to be selected is fixed, and voltages to be applied to the plate and bit lines are alternately varied. Furthermore, in the first embodiment, at the time of switching the memory cell to which a stress voltage is to be applied (i.e., the memory cell to be tested), two word lines are temporarily both selected, i.e., they are temporarily both set at "L", thereby preventing the plate line PL and the bit line BL from short-circuiting. In addition, after application of a stress voltage to the unit cells in one unit block is completed, the "L" voltage is applied to the bit line BL and plate line PL, and the "H" voltage is applied to all the word lines (in the non-selected state), thereby effecting initialization. Thereby, the time periods for which a stress voltage is applied to unit cells selected by respective word lines can be equalized.

The Second Embodiment

A ferroelectric memory included in an integrated circuit according to the second embodiment of the present invention will be explained. In the second embodiment, as in the first embodiment, the number of times the bit line BL and the plate line PL are driven is decreased, and word lines are successively switched, thereby applying a stress voltage to the cell to be tested (ferroelectric capacitor). As a result, the time required for the fatigue test is shortened, since the above setting is based on a fact wherein the time for driving the bit line BL and plate line PL is relatively long, and that for driving the word lines is short as they can be charged/discharged for a short time period.

FIG. 14 is a block diagram of the structure of the ferroelectric memory included in the integrated circuit device according to the second embodiment of the present invention. The ferroelectric memory in the second embodiment is the same as that in the first embodiment, except that in the second embodiment, the test signal TOE and test signal TWE are input to a word line selecting circuit 21, and outputting of the word line driving signal WLDi is controlled by the test signals TOE and TWE. A circuit diagram of the word line selecting circuit 21 is shown in FIG. 15. The word line selecting circuit 21 is provided with a test word line controlling circuit 15B for controlling outputting of the word line driving signal WLDi by using the test signals TOE and TWE at the fatigue test time. Application of voltages to the bit line BL and plate line PL is carried out at the timing of driving the output enable signal /OE and the write enable signal /WE, as in the first embodiment. Also, the other structural features are the same as those in the first embodiment.

Figure 16:
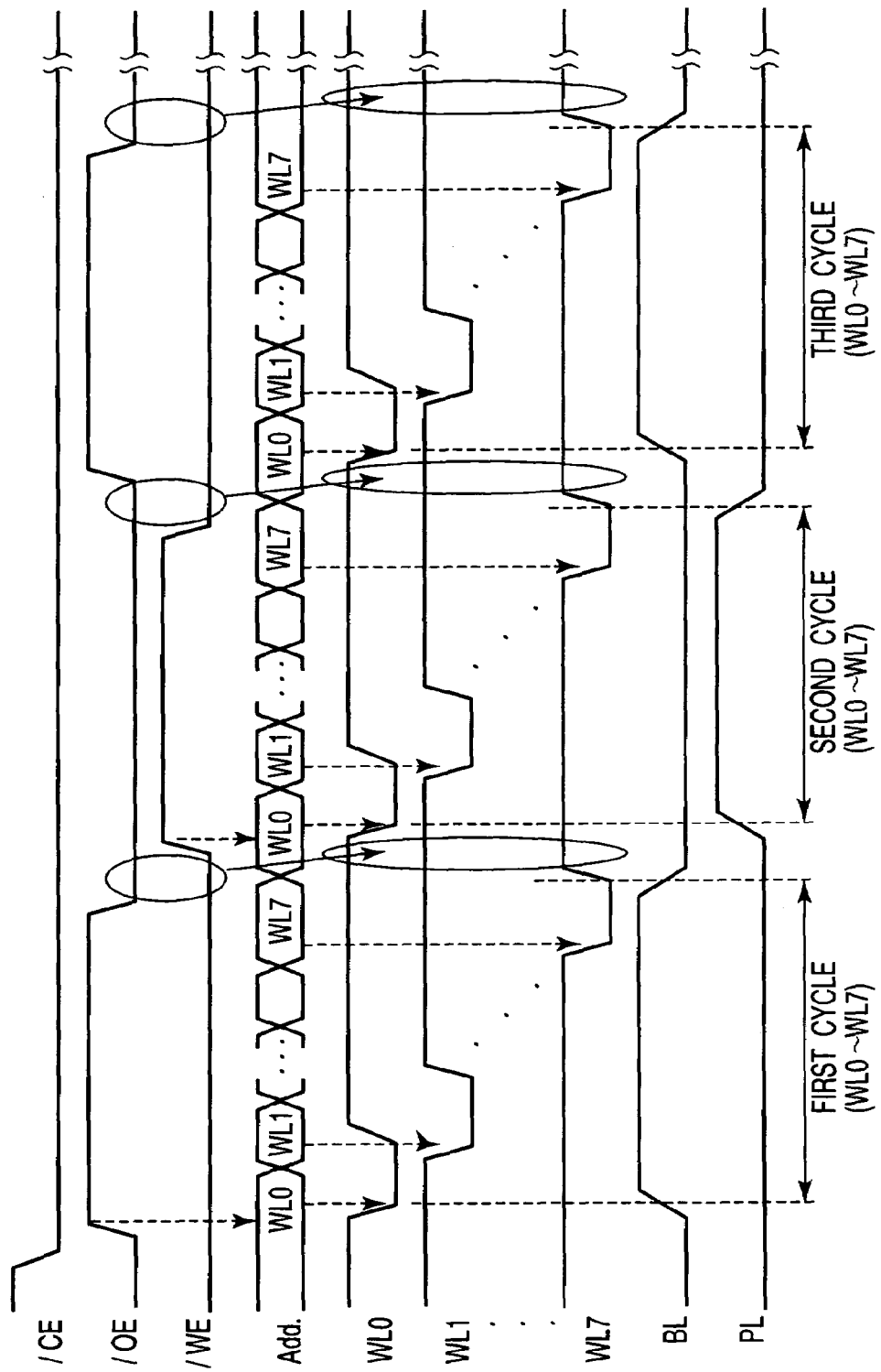
FIG. 16 is a timing chart showing an operation waveform in a fatigue test of the ferroelectric memory in the second embodiment.

FIG. 16 is a timing chart showing an operation waveform in a fatigue test of the ferroelectric memory in the second embodiment. This operation is the same as that in the first embodiment which is shown in FIG. 11, except that during the fatigue test, the chip enable signal /CE is fixed at "L", and the test can be carried out by changing the output enable signal /OE and write enable signal /WE and the address of one unit block. Application of a stress voltage to the cell to be tested can be performed in the same manner as in the first embodiment.

The outline of the operation performed in the second embodiment will be explained with reference to FIGS. 8 and 16.

In an active state in which the chip enable signal /CE is at "L", after a leading address is set, the output enable signal /OE is set at "H", and a high voltage ("H") is applied to the bit line BL. Furthermore, a low voltage ("L" (=ground potential)) is applied to a plate line PL, while keeping the write enable signal /WE at "L". Then, a selected state is achieved in which the block selecting line BS is at "H", and the word line WL0 is at "L", and a stress voltage is applied to the ferroelectric capacitor C0 connected in parallel with the cell transistor T0 whose gate is the word line WL0. At this time, the word lines WL1 to WL7 are in the non-selected state, and the cell transistors T1 to T7 are in the ON state. Thus, a stress voltage is not applied to the remaining ferroelectric capacitors, i.e., the ferroelectric capacitors C1 to C7.

Next, when the row address signal is switched, and the word line to be selected is switched from the word line WL0 to the word line WL1, the voltage to be applied to the word line WL 1 is immediately changed to the "H" voltage to the "L" voltage, and then after a lapse of a given time period, the voltage to be applied to the word line WL0 is changed from the "L" voltage to the "H" voltage. Thereby, the ferroelectric capacitor to be subjected to application of the stress voltage is changed from the ferroelectric capacitor C0 to the ferroelectric capacitor C1. Furthermore, the row address signals are sequentially switched, thereby sequentially selecting the word lines WL2 to WL7 in this order, and sequentially switching the ferroelectric capacitor to be tested, to which a stress voltage is to be applied, in the order of the ferroelectric capacitors C2 to C7. When the above switching of the ferroelectric capacitors of one unit block is completed, the voltages to be applied to the word lines WL0 to WL7 are all set to be the "H" voltage (non-selected state), and the output enable signal /OE to returned to "L". The voltages to be applied to the word lines WL0 to WL7 are all set to be the "H" voltage, thereby turning on all the cell transistors T0 to T7, and the output enable signal /OE and the write enable signal /WE are both set at "L", whereby the bit line BL and plate line PL are set at "L". Thereby, the bit line BL and the plate line PL are short-circuited to each other through the unit block. When the above operations are completed, the first cycle ends.

Then, the second cycle starts. In the second cycle, after setting a leading address, the write enable signal /WE is set at "H", and a high voltage ("H") is applied to the plate line PL. Further, a low voltage ("L"(=ground potential)) is applied to the bit line BL, while keeping the output enable signal /OE at "L".

As in the first cycle, in the second cycle, row address signals corresponding to one unit block are changed, switching the ferroelectric capacitor to be subjected to application of a stress voltage. When switching of the ferroelectric capacitors in one unit block is completed, the write enable signal /WE and the output enable signal /OE are both set at "L", and the word lines are all set at "H" (non-selected state), effecting initialization. Those operations equalize the time periods for which a stress voltage is applied to cells to be tested and selected by respective word lines, as in the first embodiment. Thereby, the time required for the fatigue test can be shortened. Thereafter, the remaining cycles successively follow the second cycle.

Next, a dynamic imprint test of the ferroelectric memory in the second embodiment will be explained.

Figure 17:
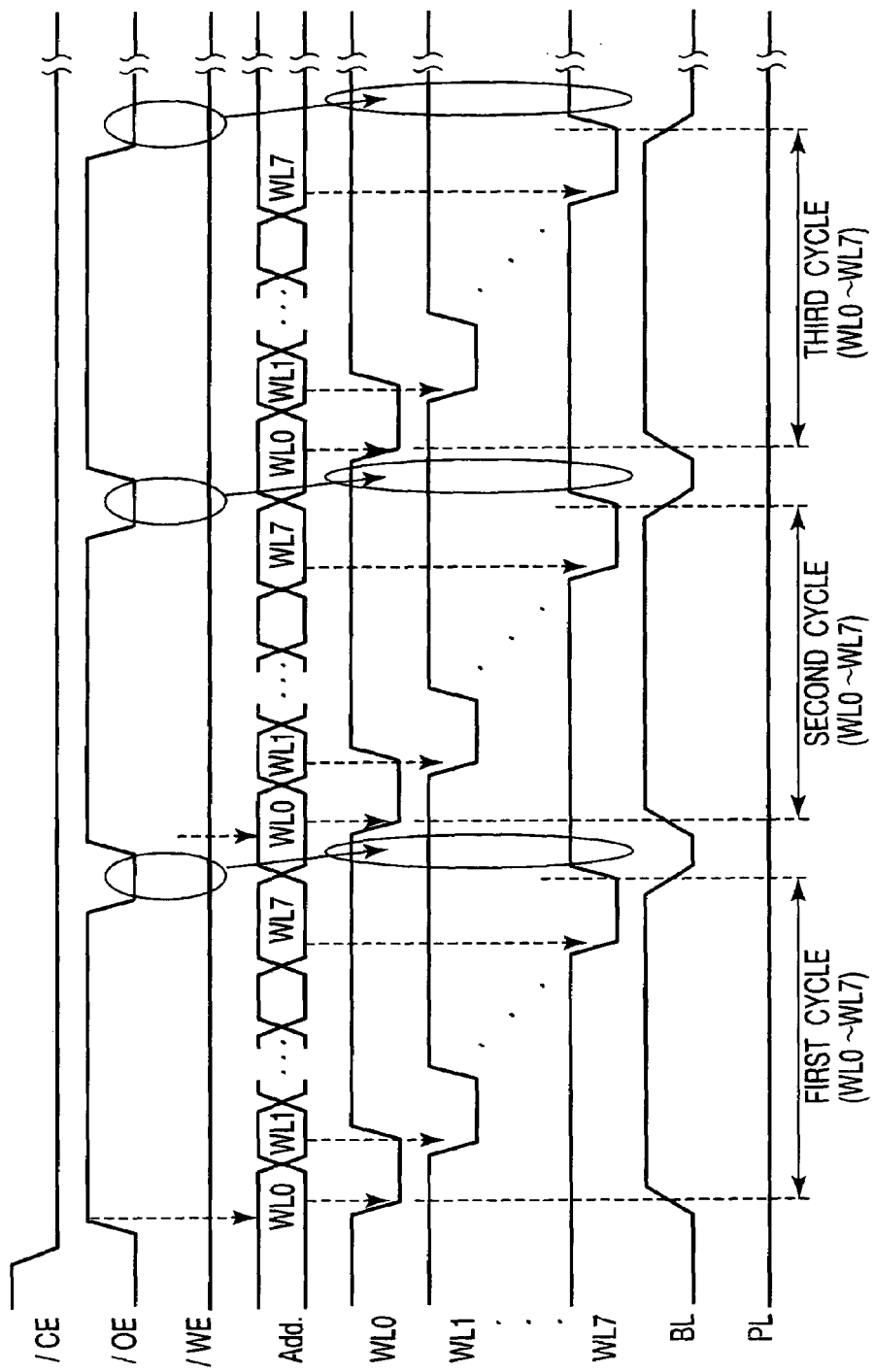
FIG. 17 is a timing chart showing an operation waveform in a dynamic imprint test of the ferroelectric memory in the second embodiment.
Figure 18:
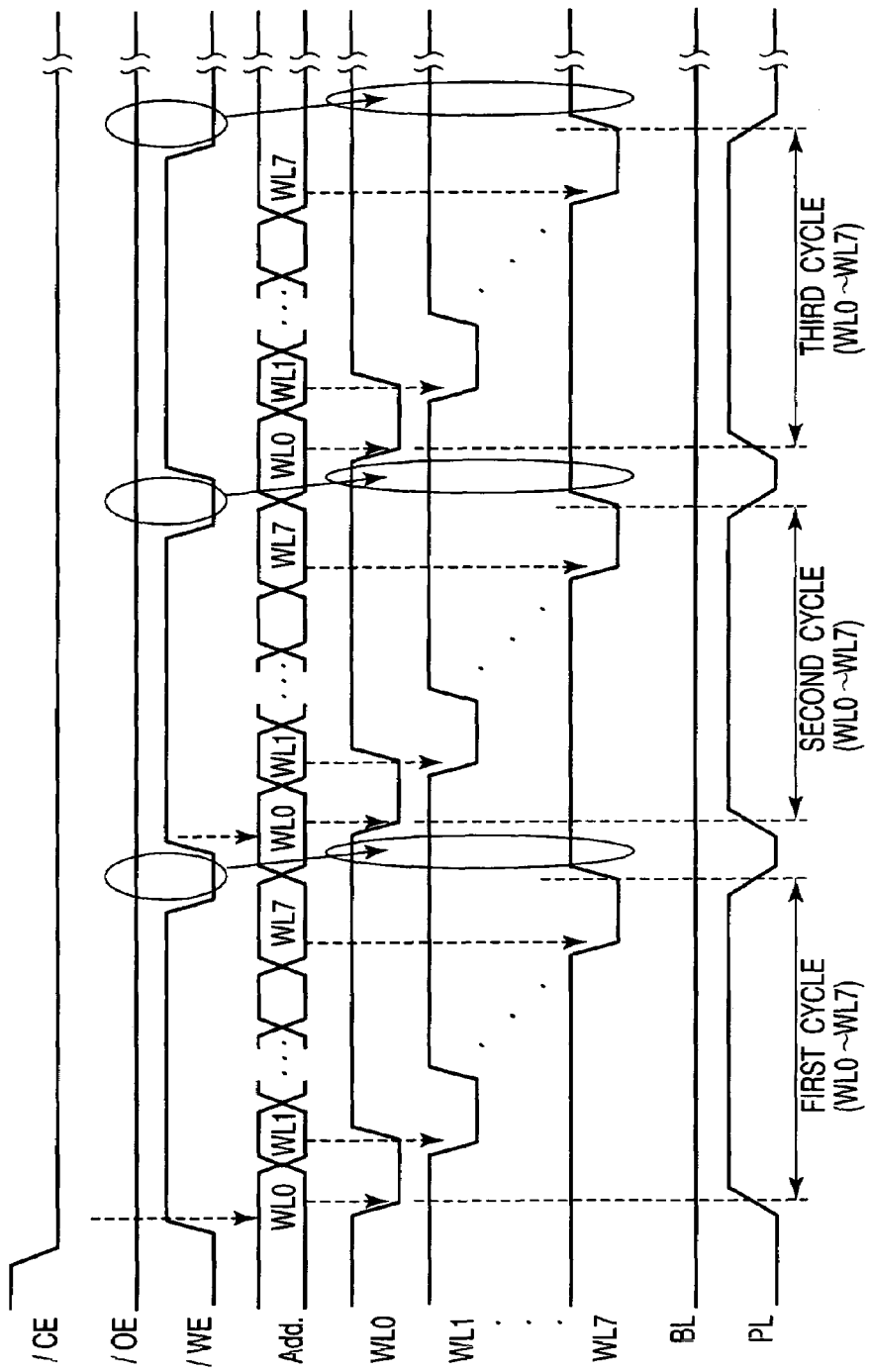
FIG. 18 is a timing chart showing an operation waveform in another dynamic imprint test of the ferroelectric memory in the second embodiment.

FIGS. 17 and 18 are timing charts showing operation waveforms in dynamic imprint tests on the ferroelectric memory in the second embodiment.

To be more specific, FIG. 17 shows an operation wave in the case where a high voltage ("H") and a low voltage ("L") are respectively applied to the bit line BL side and plate line PL side of a unit cell to be tested. FIG. 18 is an operation wave in the case where a low voltage and a high voltage are respectively applied to the bit line BL side and plate line PL side of the unit cell to be tested.

Those two dynamic imprint tests can be carried out by controlling the output enable signal /OE and the write enable signal /WE and changing the address of one unit block, while keeping the chip enable signal /CE fixed at "L" during a fatigue test. A stress voltage can be applied to a unit cell to be tested, in the same manner as in the first embodiment explained with reference to FIGS. 12 and 13.

As explained above, in the second embodiment, as in the first embodiment, voltages to be applied to the plate and bit lines are fixed during one active cycle, and the memory cells are successively selected and subjected to application of a stress voltage. This method can shorten the time for the test, since the time for charging/discharging the plate and bit lines can be omitted, compared with a test method in which the voltages to the plate and bit lines are alternately switched. Furthermore, at the time of switching the memory cell (to be tested) to be subjected to application of the stress voltage, two word lines WL are temporarily both selected, i.e., they are temporarily both set at "L", thereby preventing short-circuiting of the plate line PL and bit line BL. Furthermore, after application of the stress voltage to the unit cells of one unit block is completed, the bit line BL and the plate line PL are both set at "L", and the word lines are all set at "H" (non-elected state), thus effecting initialization. Thereby, the time periods for which a stress voltage is applied to the word lines WL can be equalized.

In addition, in the second embodiment, the test can be carried out by controlling the output enable signal /OE and the write enable signal /WE and changing the address to be selected with respect to the unit block, with the chip enable signal /CE kept at "L". Thus, controlling of an externally input signal can be simplified.

The Third Embodiment

A ferroelectric memory included in an integrated circuit device according to the third embodiment of the present invention will be explained. In the third embodiment also, as in the first and second embodiments, the number of times the bit line BL and plate line PL are driven is decreased, and the word lines are successively selected, thereby applying a stress voltage to the cell to be tested (ferroelectric capacitor), in order to shorten the time required for the fatigue test. This is based on a fact wherein the time for driving the bit line BL and plate line PL is relatively long, and that for driving the word lines is short as they can be charged/discharged for a short time period.

Figure 19:
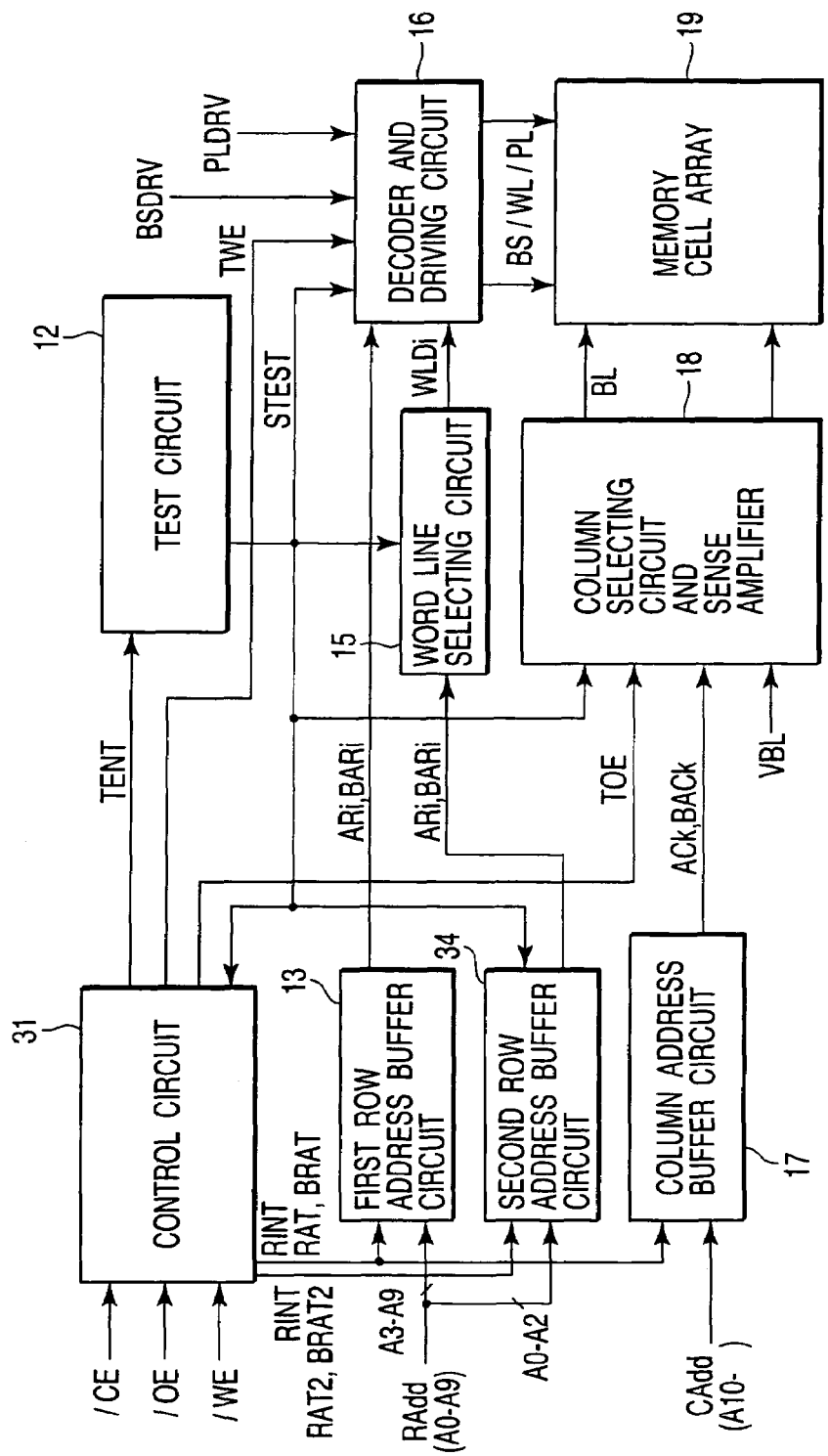
FIG. 19 is a block diagram of the structure of a ferroelectric memory included in an integrated circuit device according to a third embodiment of the present invention.

FIG. 19 is a block diagram of the structure of the ferroelectric memory included in the integrated circuit device according to the third embodiment of the present invention.

Figure 20:
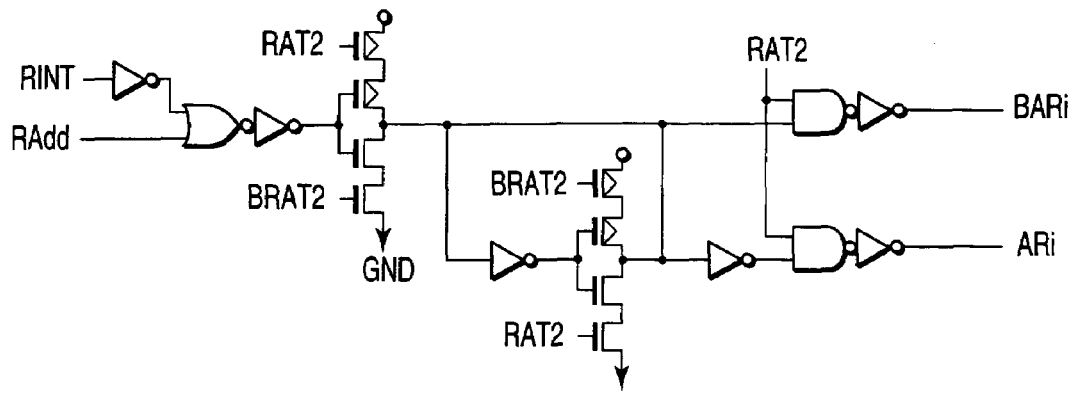
FIG. 20 is a circuit diagram of the structure of a second row address buffer circuit in the ferroelectric memory in the third embodiment.
Figure 21:
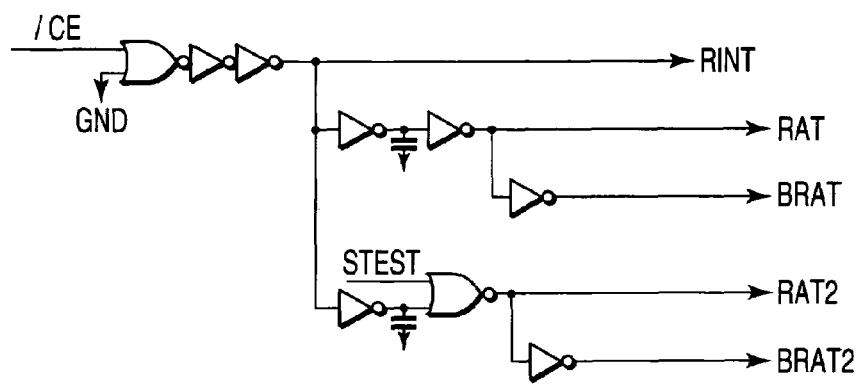
FIG. 21 is a circuit diagram of the structure of a chip enable buffer portion of a control circuit in the ferroelectric memory in the third embodiment.

The third embodiment is the same as the first embodiment except for the following point:

In the first embodiment, the second row address buffer circuit to which the row address signals A0 to A2 are to be input is an address buffer having a non-latching function. On the other hand, in the third embodiment, a second row address buffer circuit 34 is an ordinary address buffer circuit as shown in FIG. 20, and the address latch signals RTA and BRAT are replaced by address latch signals RAT2 and BRAT2. Furthermore, in a control circuit 31, the chip enable buffer which receives a chip enable signal /CE as shown in FIG. 3A is modified, and an output circuit for outputting address latch signals RAT2 and BRAT2, which are controlled by the stress test signal STEST, is added as shown in FIG. 21. Due to use of the second row address buffer circuit 34 and control circuit 31 having the above structures, the row address signal RAdd is not latched when the stress test signal STEST is at "H", i.e., at the fatigue test time.

In addition, in the third embodiment, application of voltages to the bit line BL and plate line PL is carried out at the timing of driving the output enable signal /OE and the write enable signal /WE as in the first embodiment. The other structure and advantage obtained thereby are the same as those in the first embodiment.

The Fourth Embodiment

A ferroelectric memory included in an integrated circuit device according to the fourth embodiment of the present invention will be explained.

In the fourth embodiment also, the word lines WL are successively selected, and a stress voltage is applied to the cell (ferroelectric capacitor) to be tested, in order to shorten the time required for the fatigue test, as in the first to third embodiments. This is advantageous since the time for charging/discharging the word lines WL is short, and that for driving them is also short.

Figure 22:
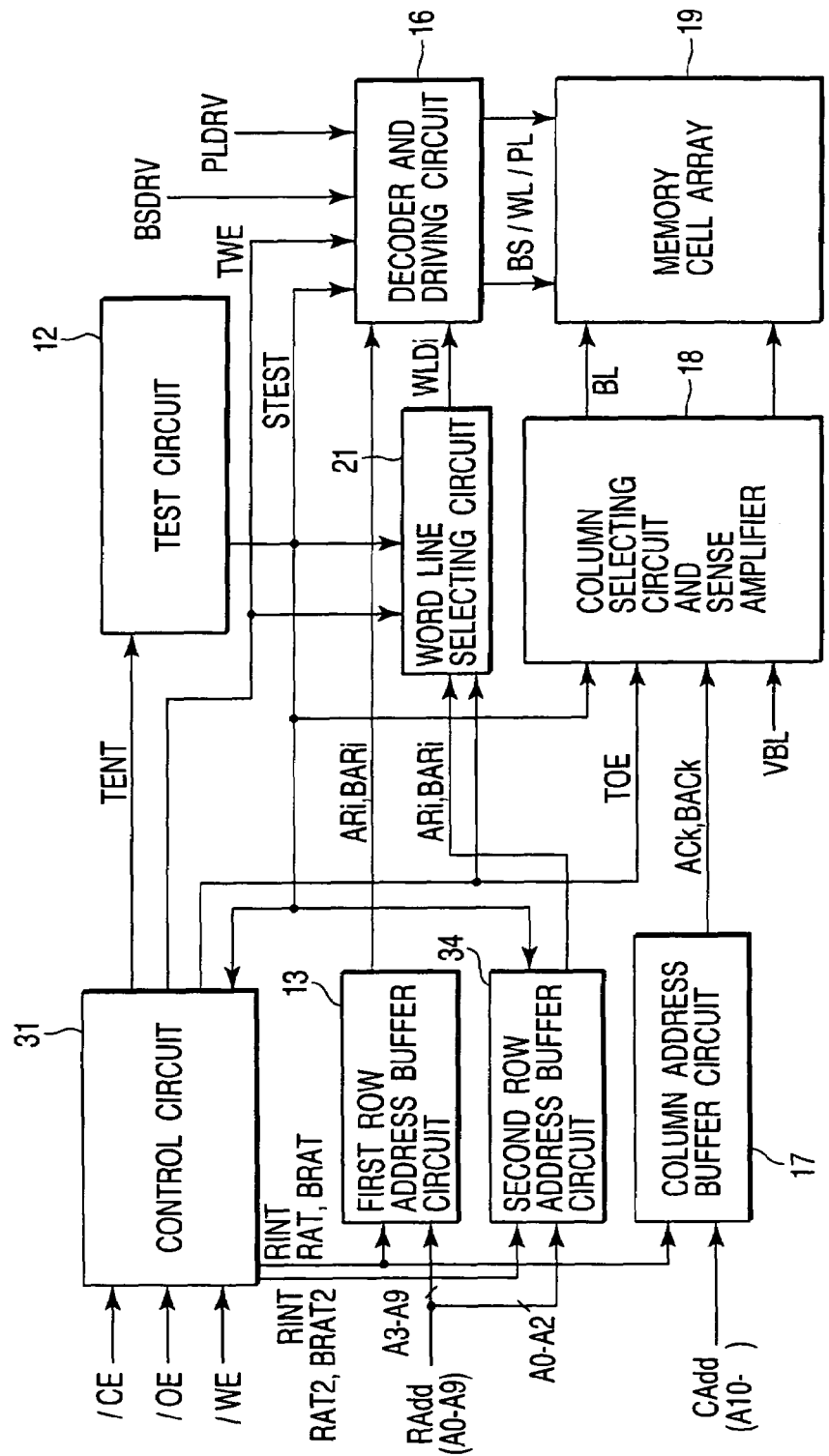
FIG. 22 is a block diagram of the structure of a ferroelectric memory included in an integrated circuit device according to a fourth embodiment of the present invention.

FIG. 22 is a block diagram of the structure of the ferroelectric memory included in then integrated circuit device according to the fourth embodiment of the present invention.

The fourth embodiment is the same as the second embodiment except for the following point:

In the second embodiment, the second row address buffer circuit to which the row address signals A0 to A2 are to be input is an address buffer having a non-latching function. The second row address buffer circuit 34 in the fourth embodiment, as well as that in the third embodiment, is an ordinary address buffer circuit as shown in FIG. 20, and the address latch signals RTA and BRAT are replaced by the address latch signals RAT2 and BRAT2. Furthermore, in the control circuit 31 in the fourth embodiment, the chip enable buffer which receives a chip enable signal /CE as shown in FIG. 3A is modified, and the output circuit for outputting the address latch signals RAT2 and BRAT2, which are controlled by the stress test signal STEST, is added as shown in FIG. 21.

In addition, the word line selecting circuit 21 in the fourth embodiment, as well as that in the second embodiment, is modified to have such a structure as shown in FIG. 15.

In the fourth embodiment, due to use of the second row address buffer circuit 34 and control circuit 31 having the above structures, the row address signal RAdd is not latched when the stress test signal STEST is at "H", i.e., at the fatigue test time. Furthermore, in the fourth embodiment, the word line selecting circuit 21 is used to enable the test to be carried out by controlling the output enable signal /OE and the write enable signal /WE, and changing the address of one unit block, with the chip enable signal /CE kept at "L". Thus, controlling of an externally input signal can be simplified.

In addition, in the fourth embodiment, application of voltages to the bit line BL and plate line PL is carried out at the timing of driving the output enable signal /OE and the write enable signal /WE as in the first embodiment. The other structure and advantage obtained thereof in the fourth embodiment are the same as those in the first embodiment.

The advantages of the embodiments of the present invention will be explained.

In a conventional test for applying a stress voltage to a ferroelectric capacitor included in each of memory cells in a series-connected TC parallel unit ferroelectric memory, the cell to be tested is fixed, the potential of the plate line or bit line is changed, thereby applying a stress voltage to the ferroelectric capacitor. However, in such a test method, it is necessary to set a long time period as the time period for changing the voltages to be applied to the bit line BL and plate line PL, which have relatively large parasitic capacitances, in order to charge/discharge the bit line BL and the plate line PL. On the other hand, in the embodiments of the present invention, the word lines whose capacitances are relatively small are successively selected, and the number of times the voltage to the plate line or bit line, whose capacitances are relatively large, is changed, is decreased, whereby the time for which the voltage is changed can be set to be shorter than that in the conventional test method. As a result, in the test method used in each of the embodiments of the present invention, the time required for the test can be reduced to about a third that in the conventional test method.

Furthermore, in recent years, as memory cells have come smaller, and ferroelectric memories having a larger number of memory cells and large capacitances have been produced. Consequently, the bit and plate lines have come to have larger capacitances. When the test method of the present invention is applied to such a ferroelectric memory, its advantage is clearly apparent. To be more specific, the invention can reduce the time for the test to a quarter or a fifth that taken by the conventional test method.

The embodiments of the present invention can provide an integrated circuit device including a series-connected TC parallel unit ferroelectric memory in which the time required for a test, in which a stress voltage is applied to ferroelectric capacitors included in memory cells, can be shortened, and a method for testing the above series-connected TC parallel unit ferroelectric memory.

The above embodiments can be separately put to practical use, and can be also appropriately combined to be put to practical use. Furthermore, the embodiments contain various inventive aspects at different levels. Thus, a number of inventions at different levels can be extracted by properly selectively combining the structural elements disclosed above with respect to the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An integrated circuit device comprising:
   a memory cell block comprising memory cells connected in series, the memory cell comprising a cell transistor and a ferroelectric capacitor, the cell transistor including a current path and a gate which is connected to a word line, and the ferroelectric capacitor including a first electrode and a second electrode, one end of the current path of the cell transistor being connected to the first electrode, and the other end of the current path of the cell transistor being connected to the second electrode;
   a word line selecting circuit which selects the word lines connected to the cell transistors in sequence from a memory cell at one end of the memory cell block to a memory cell at the other end of the memory cell block, in response to address signals during an active cycle; and
   a driving circuit which applies a given voltage between ends of a current path provided of the cell transistors in the memory cells in the memory cell block, during a time period for which the word lines connected to the cell transistors are selected in sequence by the word line selecting circuit.

2. The integrated circuit device according to claim 1, further comprising:
   an address buffer circuit which outputs the address signals to the word line selecting circuit, without latching the address signals, during the active cycle.

3. The integrated circuit device according to claim 1, further comprising:
   a first address buffer circuit which latches the address signals, and outputs the address signals to the word line selecting circuit, during the active cycle in a regular operation time; and
   a second address buffer circuit which outputs the address signals to the word line selecting circuit without latching the address signals, during the active cycle in a test mode.

4. The integrated circuit device according to claim 1, wherein a first period while the word line selecting circuit selects a first word line in response to a first address signal overlaps with a second period while the word line selecting circuit selects a second word line in response to a second address signal subsequent to the first address signal.

5. The integrated circuit device according to claim 1, further comprising:
   a block selecting transistor whose one terminal is connected to an end of the cell transistors in the memory cell block;
   a bit line connected to another terminal of the block selecting transistor; and
   a plate line connected to another end of the cell transistors in the memory cell block,
   wherein the driving circuit includes a column selecting circuit which drives the bit line and a plate line driving circuit which drives the plate line.

6. The integrated circuit according to claim 5, wherein during the active cycle, the column selecting circuit applies a high voltage to the bit line, and the plate line driving circuit applies a low voltage which is lower than the high voltage to the plate line, and during another active cycle subsequent to the active cycle, the column selecting circuit applies the low voltage to the bit line, and the plate line driving circuit applies the high voltage to the plate line.

7. An integrated circuit device comprising:
   a memory cell block comprising memory cells connected in series, the memory cell comprising a cell transistor including a gate which is connected to a word line, and a ferroelectric capacitor including electrodes connected to terminals of the cell transistor;
   a first address buffer circuit which latches an address signal and outputs the address signal, an address signal identifying one of the word lines connected to the cell transistors in the memory cell block,
   a second address buffer circuit which outputs the address signal without latching the address signal;
   a switching circuit which receives the address signals output from the first address buffer circuit and the second address buffer circuit, and then outputs the address signal output from the first address buffer circuit in a regular operation time in which one of writing and reading is performed, and outputs the address signal output from the second address buffer circuit in a test mode in which a test is carried out on the memory cells;
   a word line selecting circuit which selects the one of the word lines connected to the cell transistors, in response to the address signal output from the switching circuit; and
   a driving circuit which applies a given voltage between ends of a current path provided of the cell transistors in the memory cells in the memory cell block, during a time period in which the one of the word lines is selected in response to the address signal output from the second address buffer circuit.

8. The integrated circuit device according to claim 7, wherein a first period while the word line selecting circuit selects a first word line in response to a first address signal overlaps with a second period while the word line selecting circuit selects a second word line in response to a second address signal subsequent to the first address signal.

9. The integrated circuit device according to claim 8, wherein the word line selecting circuit sets the first word line in a non-selected state, after setting the second word line in the selected state.

10. The integrated circuit device according to claim 7, wherein the word line selecting circuit includes a delay circuit which delays outputting of the address signal identifying the word line which is selected in the test mode.

11. The integrated circuit device according to claim 7, wherein when one of the cell transistors which is connected to one of the word line selected by the word line selecting circuit is turned off, and the others of the cell transistors which are connected the others of the word lines are turned on, the given voltage is applied to the electrodes of the ferroelectric capacitor forming the memory cell with the one cell transistor which is connected to the selected word lines.

12. The integrated circuit device according to claim 7, wherein the word line selecting circuit successively selects the word lines from the word line which is connected to the cell transistor at one end of the memory cell block to the word line which is connected to the cell transistor at another end of the memory cell block, in response to successive address signals.

13. The integrated circuit device according to claim 7, further comprising:
   a block selecting transistor whose one terminal is connected to an end of the cell transistors in the memory cell block;
   a bit line connected to another terminal of the block selecting transistor; and
   a plate line connected to another end of the cell transistors in the memory cell block,
   wherein the driving circuit includes a column selecting circuit which drives the bit line and a plate line driving circuit which drives the plate line.

14. The integrated circuit device according to claim 13, wherein during a first cycle in which the word lines connected to the cell transistors in the memory cell block are successively selected, the column selecting circuit applies a high voltage to the bit line, and the plate line driving circuit applies a low voltage which is lower than the high voltage to the plate line, and during a second cycle in which the word lines are successively re-selected after the first cycle, the column selecting circuit applies the low voltage to the bit line, and the plate line driving circuit applies the high voltage to the plate line.

15. A method for testing an integrated circuit device which comprises a memory cell block comprising memory cells connected in series, the memory cell comprising a cell transistor including a gate which is connected to a word line, and a ferroelectric capacitor including electrodes connected to terminals of the cell transistor, the method comprising:
   turning off a first cell transistor of the cell transistors, which is included in a first memory cell of the memory cells in the memory cell block, and tuning on the other transistors of the cell transistors, which are included in the other memory cells;
   turning off a second cell transistor adjacent to the first cell transistor;
   turning on the first cell transistor after turning off the second cell transistor; and applying a given voltage between ends of a current path provided of the cell transistors in the memory cells in the memory cell block, from time the first cell transistor is turned off to time the first cell transistor is turned on.

16. The method according to claim 15, wherein the given voltage is applied to electrodes of a first ferroelectric capacitor which is included in the first cell transistor, and then the given voltage is applied to electrodes of a second ferroelectric capacitor which is included in the second cell transistor.

17. The method according to claim 15, wherein when the second cell transistor is turned off, the first cell transistor and the second cell transistor are both in an OFF state for a given time period.

18. The method according to claim 15, wherein the cell transistors are successively turned off from an end of the cell transistors to the other end of the cell transistors in the memory cells in the memory cell block.

19. The method according to claim 18, wherein after the cell transistors are successive turned off from the end of the cell transistors to the other end of the cell transistors, a ground potential is applied to the end and the other end of the cell transistors.

* * * * *